United States Patent
Kim et al.

(10) Patent No.: US 11,450,826 B2
(45) Date of Patent: Sep. 20, 2022

(54) LIGHT EMITTING DEVICE, METHOD OF MANUFACTURING SAME AND DISPLAY DEVICE INCLUDING SAME

(71) Applicant: SAMSUNG ELECTRONICS CO., LTD., Suwon-si (KR)

(72) Inventors: Tae Ho Kim, Seongnam-si (KR); Won Sik Yoon, Seoul (KR); Jeong Hee Lee, Seongnam-si (KR); Eun Joo Jang, Suwon-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 135 days.

(21) Appl. No.: 17/083,832

(22) Filed: Oct. 29, 2020

(65) Prior Publication Data

US 2021/0057664 A1    Feb. 25, 2021

Related U.S. Application Data

(62) Division of application No. 16/530,253, filed on Aug. 2, 2019, now Pat. No. 10,854,836.

(30) Foreign Application Priority Data

Aug. 3, 2018    (KR) .................. 10-2018-0090844

(51) Int. Cl.
*H01L 33/26* (2010.01)
*H01L 51/50* (2006.01)
(Continued)

(52) U.S. Cl.
CPC ........ *H01L 51/502* (2013.01); *H01L 51/5206* (2013.01); *H01L 51/5237* (2013.01);
(Continued)

(58) Field of Classification Search
CPC ....... H01L 33/26; H01L 51/50; H01L 51/502; H01L 51/52; H01L 51/5206; H01L 51/5237; H01L 51/56
(Continued)

(56) References Cited

U.S. PATENT DOCUMENTS

| | | |
|---|---|---|
| 7,910,400 B2 | 3/2011 | Kwon et al. |
| 9,496,141 B2 | 11/2016 | Kazlas et al. |

(Continued)

FOREIGN PATENT DOCUMENTS

| | | |
|---|---|---|
| CN | 106356462 A | 1/2017 |
| JP | 2005502176 A | 1/2005 |

(Continued)

OTHER PUBLICATIONS

Chen et al., "Chloride-Passivated Mg-Doped ZnO Nanoparticles form Improving Performance of Cadmium-Free, Quantum-Dot Light-Emitting Diodes", ACS Photonics, 5, 2018. 3704-3711.
(Continued)

*Primary Examiner* — Fazli Erdem
(74) *Attorney, Agent, or Firm* — Cantor Colburn LLP

(57) ABSTRACT

A light emitting device includes: a first electrode and a second electrode facing each other, an emissive layer disposed between the first electrode and the second electrode and including a quantum dot, an electron auxiliary layer disposed between the emissive layer and the second electrode and including a plurality of nanoparticles, and a polymer layer between a portion of the second electrode and the electron auxiliary layer, wherein the nanoparticles include a metal oxide including zinc, wherein the second electrode has a first surface facing a surface of the electron auxiliary layer and a second surface opposite to the first surface, and the polymer layer is disposed on a portion of the second surface and a portion of the surface of the electron
(Continued)

auxiliary layer, and wherein the polymer layer includes a polymerization product of a thiol compound and an unsaturated compound having at least two carbon-carbon unsaturated bonds.

20 Claims, 10 Drawing Sheets

(51) Int. Cl.
  *H01L 51/52* (2006.01)
  *H01L 51/56* (2006.01)
  *H01L 27/32* (2006.01)
(52) U.S. Cl.
  CPC ............. *H01L 51/56* (2013.01); *H01L 27/32* (2013.01); *H01L 2251/308* (2013.01)
(58) Field of Classification Search
  USPC .......................................................... 257/40
  See application file for complete search history.

(56) References Cited

U.S. PATENT DOCUMENTS

| | | |
|---|---|---|
| 9,780,256 B2 | 10/2017 | Yang et al. |
| 10,056,523 B2 | 8/2018 | Kazlas et al. |
| 2003/0042850 A1 | 3/2003 | Bertram et al. |
| 2015/0218444 A1 | 8/2015 | Kang et al. |
| 2016/0005932 A1 | 1/2016 | Lee et al. |
| 2016/0160060 A1 | 6/2016 | Kikuchi et al. |
| 2016/0264820 A1 | 9/2016 | Kikuchi et al. |
| 2018/0057658 A1 | 3/2018 | Qiu et al. |
| 2018/0151817 A1 | 5/2018 | Cho et al. |
| 2019/0276734 A1 | 9/2019 | Kim et al. |
| 2019/0280233 A1 | 9/2019 | Kim et al. |
| 2020/0172806 A1 | 6/2020 | Park et al. |

FOREIGN PATENT DOCUMENTS

| | | |
|---|---|---|
| KR | 0754396 B1 | 8/2007 |
| KR | 20120089338 A | 8/2012 |
| KR | 20160113112 A | 9/2016 |
| KR | 20170137882 A | 12/2017 |

OTHER PUBLICATIONS

European Search Report for European Patent Application No. 19189798.2 dated Oct. 16, 2019.

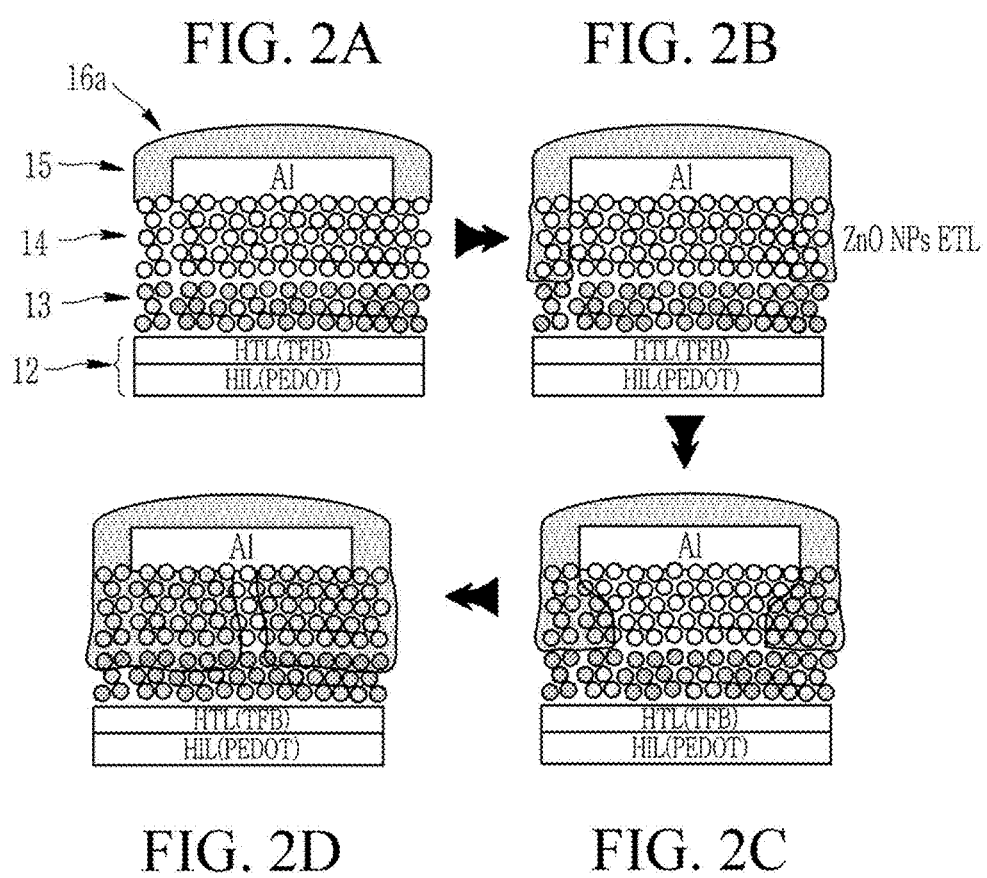

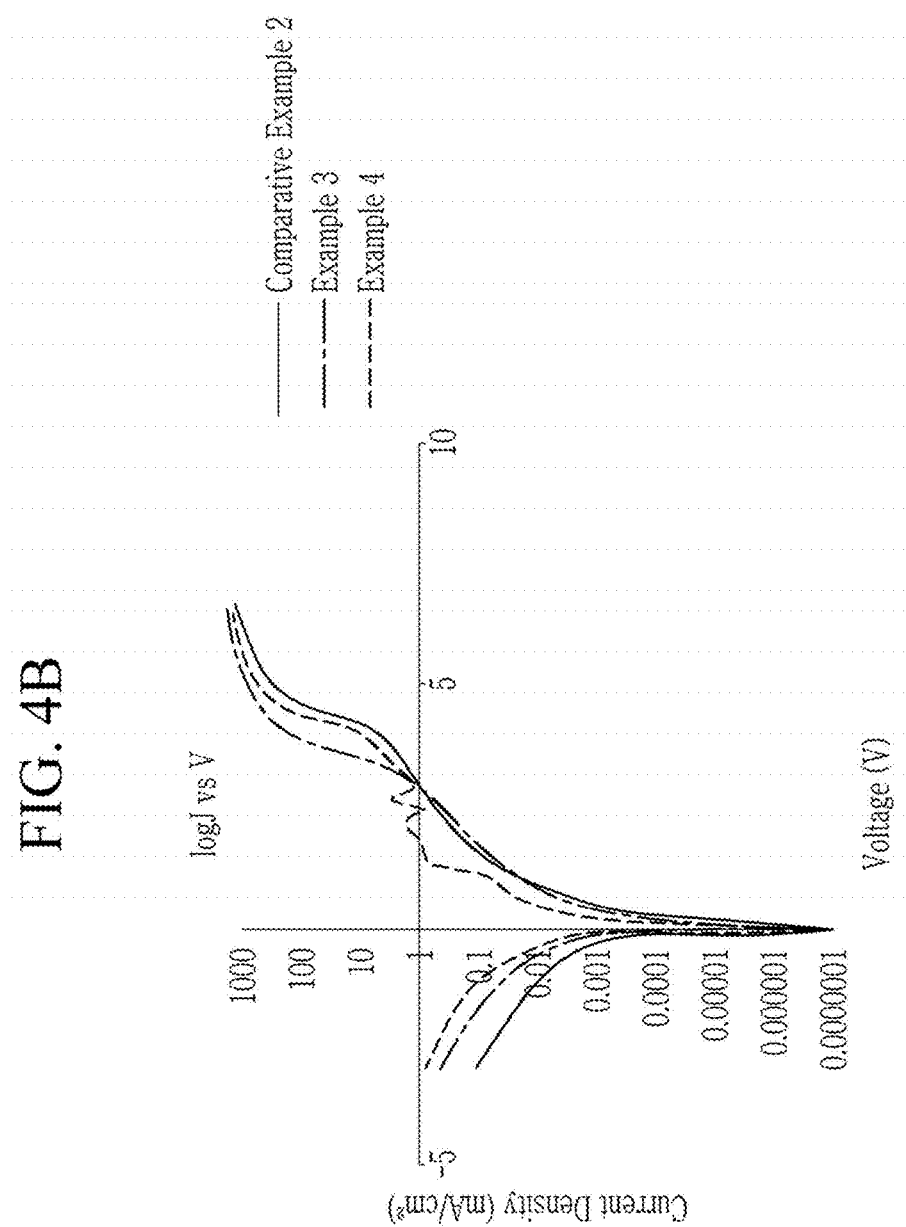

LIGHT EMITTING DEVICE, METHOD OF MANUFACTURING SAME AND DISPLAY DEVICE INCLUDING SAME

CROSS-REFERENCE TO RELATED APPLICATION

This is a divisional application of U.S. patent application Ser. No. 16/530,253, filed on Aug. 2, 2019, which claims priority to and the benefit of Korean Patent Application No. 10-2018-0090844, filed in the Korean Intellectual Property Office on Aug. 3, 2018, and all the benefits accruing therefrom under 35 U.S.C. § 119, the contents of which is incorporated herein by reference in its entirety.

BACKGROUND

1. Field

A light emitting device, a method of manufacturing the light emitting device, and a display device including the light emitting device are disclosed.

2. Description of the Related Art

Light emitting devices including a semiconductor nanocrystal, also known as a quantum dot (QD), have been developed. Unlike a bulk material, a nanoparticle such as a quantum dot has intrinsic physical characteristics (e.g., energy bandgap, melting point), which may be modified by changing the particle size of the quantum dot. For example, when supplied with photoenergy or electrical energy, a quantum dot may emit light in a wavelength corresponding to the particle size of the quantum dot. Accordingly, the quantum dot may be used in a light emitting device emitting light of a particular wavelength.

An improved light emitting device including a quantum dot would be beneficial.

SUMMARY

An embodiment provides a light emitting device having improved performance.

Another embodiment provides a display device including the light emitting device.

Yet another embodiment provides a method of preparing the light emitting device.

A light emitting device according to an embodiment includes
a first electrode and a second electrode facing each other,
an emissive layer disposed between the first electrode and the second electrode and including a quantum dot, and
an electron auxiliary layer disposed between the emissive layer and the second electrode and including a plurality of nanoparticles,
wherein the nanoparticles includes a metal oxide including zinc,
wherein the second electrode has a first surface facing a surface of the electron auxiliary layer and a second surface opposite to the first surface,
wherein the light emitting device further includes a polymer layer disposed on at least a portion of the second surface and at least a portion of the surface of the electron auxiliary layer, and
wherein the polymer layer includes a polymerization product of a monomer combination including a thiol compound having at least one thiol group and an unsaturated compound having at least two carbon-carbon unsaturated bonds.

The second electrode is disposed on a portion of the surface of the electron auxiliary layer.

A work function of the first electrode may be higher than a work function of the second electrode.

The first electrode may include indium tin oxide.

The second electrode may include a conductive metal.

The quantum dot may not include cadmium.

The quantum dot may include indium and phosphorus.

The quantum dot may include a chalcogen element and zinc.

In the light emitting device, an absolute value of lowest unoccupied molecular orbital (LUMO) energy level of the quantum dot may be less than an absolute value of LUMO energy level of the metal oxide.

The metal oxide may have a composition represented by Chemical Formula A:

$$Zn_{1-x}M_xO \qquad \text{[Chemical Formula A]}$$

wherein, M is Mg, Ca, Zr, W, Li, Ti, Y, Al, or a combination thereof and $0 \leq x \leq 0.5$.

The metal oxide may include a zinc oxide, a zinc magnesium oxide, or a combination thereof.

An average particle size of the plurality of nanoparticles may be greater than or equal to about 1 nanometer (nm) and/or less than or equal to about 10 nanometers.

The average particle size of the plurality of nanoparticles may be greater than or equal to about 1.5 nm and/or less than or equal to about 5 nm.

The polymerization product may include a cross-linked polymer.

The polymer layer may be disposed directly on the at least portion of the second surface of the second electrode and directly on the at least portion of the surface of the electron auxiliary layer.

The polymer layer may be in contact with the second surface of the second electrode and the electron auxiliary layer.

The polymer layer may cover the entire second surface of the second electrode.

The polymer layer may cover an entire area of an exposed surface of the electron auxiliary layer.

The polymer layer covers an entire area of the second surface and an entire area of the surface of the electron auxiliary layer except for the portion on which the second electrode is disposed.

The polymer layer may not include an unsaturated carboxylic acid, a saturated carboxylic acid, a polymer thereof, or a combination thereof.

The polymer layer may not include (meth)acrylic acid, benzoic acid, 3-butenoic acid, crotonic acid, butyric acid, isobutyric acid, acetic acid, propionic acid, a polymer thereof, or a combination thereof The electrode and the electron auxiliary layer, and optionally at least a portion of the emissive layer may be integrated together by the polymerization product.

The electron auxiliary layer may further includes an organic material between the nanoparticles of the plurality of nanoparticles, and the organic material may include the polymerization product, unreacted thiol compound, unreacted unsaturated compound, or a combination thereof.

The electron auxiliary layer may include sulfur. The presence of sulfur may be confirmed by, for example, a transmission electron microscopy energy dispersive X-ray (TEM-EDX) profile.

In the electron auxiliary layer, a content of sulfur may be greater than or equal to about 0.001 mole percent (mol %), or may be greater than or equal to about 0.01 mol %, relative to a total number of moles of zinc in the electron auxiliary layer.

The electron auxiliary layer may further include a thiol moiety, a sulfide moiety, or a combination thereof.

A content of carbon in the electron auxiliary layer may be greater than or equal to about 4 wt %, based on a total weight of the electron auxiliary layer.

A content of carbon in the electron auxiliary layer may be greater than or equal to about 5 wt %, based on a total weight of the electron auxiliary layer.

The electron auxiliary layer may have a content of carbon of greater than or equal to about 10 wt %, based on a total weight of the electron auxiliary layer.

The electron auxiliary layer may have a content of carbon of greater than or equal to about 15 wt %, based on a total weight of the electron auxiliary layer.

The electron auxiliary layer may have a content of carbon of greater than or equal to about 20 wt %, based on a total weight of the electron auxiliary layer.

The electron auxiliary layer may not include polyethyleneimine.

The thiol compound may include a center moiety and at least one HS—R—* group bound to the center moiety, wherein, R is a direct bond, a substituted or unsubstituted C1 to C30 aliphatic hydrocarbon group (e.g., alkylene, alkenylene, alkynylene, or the like), a sulfonyl group, a carbonyl group, an ether group, a sulfide group, a sulfoxide group, an ester group, an amide group, or a combination thereof, * is a portion bound to an adjacent atom of the center moiety, and the center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

The monomer combination may include a multiple thiol compound having at least two thiol groups, a monothiol compound having one thiol group, or a combination thereof.

The thiol compound may include a di(mercaptoacetate) compound, a tri(mercaptoacetate) compound, a tetra(mercaptoacetate) compound, a di(mercaptopropionate) compound, a tri(mercaptopropionate) compound, a tetra(mercaptopropionate) compound, an isocyanate compound including at least two mercaptoalkyl carbonyloxyalkyl groups, an isocyanurate compound including at least two mercaptoalkyl carbonyloxyalkyl groups, or a combination thereof.

The unsaturated compound may include a center moiety and at least two X'—R—* groups bound to the center moiety, wherein, X' is a moiety including a carbon-carbon unsaturated bond, R is a direct bond, a substituted or unsubstituted C1 to C30 aliphatic hydrocarbon group (e.g., alkylene, alkenylene, alkynylene, or the like), a sulfonyl group, a carbonyl group, an ether group, a sulfide group, an sulfoxide group, an ester group, an amide group, or a combination thereof, and the center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

The unsaturated compound may include a di(meth)acrylate compound, a tri(meth)acrylate compound, a tetra(meth)acrylate compound, a penta(meth)acrylate compound, a hexa(meth)acrylate compound, or a combination thereof.

The unsaturated compound may not include a carboxylic acid group.

The monomer combination may further include a mono-unsaturated compound having one carbon-carbon unsaturated bond at the terminal end, for example, a monoacrylate compound having one (meth)acrylate group and not having other polymerizable moiety.

The monomer combination may include a monothiol compound together with a multi-thiol compound.

The polymerization product may include a triazine moiety, a triazinetrione moiety, a quinoline moiety, a quinolone moiety, or a combination thereof.

The emissive layer may further include an organic material between the quantum dots, and the organic materials may include the polymerization product, unreacted thiol compound, unreacted unsaturated compound, or a combination thereof.

The light emitting device may further include a hole auxiliary layer disposed between the first electrode and the emissive layer.

In another embodiment, a method of manufacturing the aforementioned light emitting device includes providing a stack structure including a first electrode and a second electrode facing each other, an emissive layer disposed between the first electrode and the second electrode and including a quantum dot, and an electron auxiliary layer disposed between the emissive layer and the second electrode and including a plurality of nanoparticles, wherein the plurality of nanoparticles includes a metal oxide including zinc, and the second electrode has a first surface facing the surface of the electron auxiliary layer and a second surface opposite to the first surface;

providing a polymer precursor mixture (also referred to as a monomer combination or a monomer mixture) including a thiol compound having at least one thiol (SH) group and an unsaturated compound having at least two carbon-carbon unsaturated bonds;

applying the polymer precursor mixture on at least a portion of the second surface of the second electrode and on at least a portion of the surface of the electron auxiliary layer to form a polymer precursor layer; and polymerizing the thiol compound and the unsaturated compound in the polymer precursor layer to form the light emitting device.

The polymerizing of the monomer combination may be performed for less than about 4 hours. In the method, the polymer precursor mixture penetrates and diffuses between nanoparticles of the plurality of nanoparticles in the electron auxiliary layer before the polymerizing, during the polymerizing, or a combination thereof.

The method further includes allowing the stack structure on which the polymer precursor layer is formed to stand for at least 1 minute between the forming of the polymer precursor layer on the stack structure and the polymerizing of the thiol compound and the unsaturated compound in the polymer precursor layer.

The polymerization of the monomer combination in the polymer precursor layer may be performed in an atmosphere without oxygen.

The method further includes allowing the stack structure on which the polymer precursor layer is formed to stand for at least 5 minutes between the forming of the polymer precursor layer on the stack structure and the polymerizing of the thiol compound and the unsaturated compound in the polymer precursor layer.

The polymerizing may be performed at a temperature of greater than or equal to about 30° C. and less than or equal to about 100° C.

The polymer precursor mixture may further include a photoinitiator and the polymerizing of the polymer precursor layer may include photopolymerization.

Another embodiment provides a display device including the aforementioned light emitting device.

In the embodiments, a quantum dot-based electroluminescent device having an improved efficiency and a prolonged life-span is provided. Further, the quantum dots do not include cadmium. The device according to an embodiment may prevent/suppress the life-span deterioration caused by detachment (or elimination) of a ligand from a surface of the quantum dots detachment, which may occur during operation of the light emitting device. Further, by employing the aforementioned electron auxiliary layer including metal oxide nanoparticles, performance degradation of the light emitting device, caused by surface defects in the nanoparticles, may be prevented.

BRIEF DESCRIPTION OF THE DRAWINGS

The above and other advantages and features of this disclosure will become more apparent by describing in further detail exemplary embodiments thereof with reference to the accompanying drawings, in which:

FIGS. 2A-2D are schematic views showing a process of manufacturing a light emitting device according to an embodiment;

FIG. 4B is a graph of current density ($mA/cm^2$) versus voltage (V), showing electro-luminescence properties of the light emitting devices manufactured in Examples 3 and 4 and Comparative Example 2;

DETAILED DESCRIPTION

Figure 1:
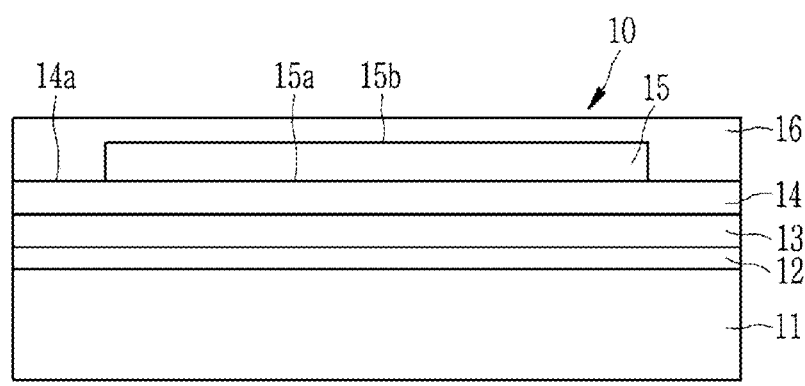
FIG. 1 is a schematic cross-sectional view of a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a work function or an energy level (e.g., highest occupied molecular orbital (HOMO) or Lowest unoccupied molecular orbital (LUMO) is expressed as an absolute value relative to a vacuum. In addition, when the work function, or the energy level, is referred to as "deep," "high" or "large," the work function or the energy level has a large absolute value based on a vacuum, i.e., 0 eV, while when the work function or the HOMO energy level is referred to as "shallow," "low," or "small," the work function or HOMO energy level has a small absolute value, based on a vacuum.

As used herein, the term "Group II" refers to Group IIA and Group IIB of the Periodic Table of the elements, and examples of Group II metals may include Cd, Zn, Hg, and Mg, but are not limited thereto.

As used herein, the term "Group III" refers to Group IIIA and Group IIIB of the Periodic Table of the elements, and examples of Group III metals may include Al, In, Ga, and Tl, but are not limited thereto.

As used herein, the term "Group IV" may refer to Group IVA and Group IVB of the Periodic Table of the elements, and examples of a Group IV metal may include Si, Ge, and Sn, but are not limited thereto.

As used herein, the term "metal" refers to metallic or metalloid elements as defined in the Periodic Table of Elements selected from Groups 1 to 17 of the Periodic Table of the elements, including the lanthanide elements and the actinide elements, and includes a semi-metal such as Si.

As used herein, the term "Group I" may refer to Group IA and Group IB of the Periodic Table of the elements, and examples may include Li, Na, K, Rb, and Cs, but are not limited thereto.

As used herein, the term "Group V" may refer to Group VA of the Periodic Table of the elements, and examples may include nitrogen, phosphorus, arsenic, antimony, and bismuth, but are not limited thereto.

As used herein, the term "Group VI" may refer to Group VIA of the Periodic Table of the elements, and examples may include sulfur, selenium, and tellurium, but are not limited thereto.

As used herein, unless a definition is otherwise provided, "substituted" refers to the replacement of hydrogen of a compound, a group, or a moiety by at least one (e.g., 1, 2, 3, or 4) substituent independently selected from a C1 to C30 alkyl group, a C2 to C30 alkenyl group, a C2 to C30 alkynyl group, a C2 to C30 epoxy group, a C2 to C30 alkenyl group, a C2 to C30 alkyl ester group, a C3 to C30 alkenyl ester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—RC(=O)O, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, "alkyl" means a straight or branched chain, saturated, monovalent hydrocarbon group (e.g., methyl or hexyl).

As used herein, "alkenyl" means a straight or branched chain, monovalent hydrocarbon group having at least one carbon-carbon double bond (e.g., ethenyl (—HC=CH$_2$)).

As used herein "alkynyl" means a straight or branched chain, monovalent hydrocarbon group having at least one carbon-carbon triple bond (e.g., ethynyl).

As used herein, "alkylene" means a straight or branched chain, saturated, aliphatic hydrocarbon group having a valence of at least two, (e.g., methylene (—CH$_2$—) or, propylene (—(CH$_2$)$_3$—)). "Alkenylene" means a straight or branched chain hydrocarbon group having at least one carbon-carbon double bond and having a valence of at least two, optionally substituted with one or more substituents where indicated, provided that the valence of the alkyl group is not exceeded.

As used herein, "cycloalkylene" means a cyclic alkylene group having a valence of at least two.

As used herein, "arylene" means a radical having a valence of at least two, formed by the removal of at least two hydrogen atoms from one or more rings of an aromatic hydrocarbon, wherein the hydrogen atoms may be removed from the same or different rings (preferably different rings), each of which rings may be aromatic or nonaromatic. "Heteroarylene" means a radical having a valence of at least two formed by the removal of at least two hydrogen atoms from one or more rings of a heteroaryl moiety, wherein the hydrogen atoms may be removed from the same or different rings (preferably the same ring), each of which rings may be aromatic or nonaromatic.

A "chalcogen" is an element of Group 16, e.g., oxygen, sulfur, selenium, or tellurium.

As used herein, "a substituted or unsubstituted C2 to C30 aliphatic hydrocarbon group in which at least one methylene is substituted by a sulfonyl group, a carbonyl group, an ether group, a sulfide group, an sulfoxide group, an ester group, an amide group, or a combination thereof" refers to a group obtained by replacing at least one methylene in a substituted or unsubstituted C2 to C30 aliphatic hydrocarbon group by a sulfonyl group, a carbonyl group, an ether group, a sulfide group, an sulfoxide group, an ester group, an amide group, or a combination thereof.

As used herein, a particle size or an average particle size may be measured by using an electron microscope analysis and optionally a commercially available image analysis program (e.g., Image J). The average may be mean or median.

Hereinafter, a light emitting device according to an embodiment is described with reference to drawings.

FIG. 1 is a schematic cross-sectional view of a light emitting device according to an embodiment.

Referring to FIG. 1, a light emitting device 10 according to an embodiment includes a first electrode 11 and a second electrode 15 facing each other, an emissive layer 13 disposed between the first electrode 11 and the second electrode 15 and including a quantum dot, a hole auxiliary layer 12 disposed between the first electrode 11 and the emissive layer 13, and an electron auxiliary layer 14 disposed between the second electrode 15 and the emissive layer 13.

A substrate (not shown) may be disposed at the side of the first electrode 11 or the second electrode 15. In an embodiment, the substrate may be disposed at the side of the first electrode. The substrate may include an insulating material (e.g., insulating transparent substrate). The substrate may include glass; a polymer such as an ester (e.g., polyethylene terephthalate (PET), polyethylene naphthalate (PEN)), a polycarbonate, a polyacrylate, a polyimide, a polyamideimide, a polysiloxane (e.g. PDMS), or a combination thereof; an inorganic material such as $Al_2O_3$, ZnO, or a combination thereof; or a combination comprising a least two of the foregoing, but is not limited thereto. The substrate may be made of a silicon wafer. As used herein, the term "transparent" refers to having a transmittance of greater than or equal to about 85% transmittance of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected considering a substrate material but is not particularly limited. The transparent substrate may be flexible. The substrate may be omitted.

The first electrode 11 may be an anode and the second electrode 15 may be a cathode.

The first electrode 11 may be made of an electrically conductive material, for example a metal, a conductive metal oxide, or a combination thereof. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto. A combination comprising at least one of the foregoing may also be used. In an embodiment, the first electrode may include a transparent conductive metal oxide, for example, indium tin oxide. A work function of the first electrode may be greater than a work function of the second electrode. Alternatively, a work function of the first electrode may be less than a work function of the second electrode.

The second electrode 15 may be made of a conductive material, for example a metal, a conductive metal oxide, a conductive polymer, or a combination thereof. The second electrode 15 may include, for example, a metal or an alloy thereof, such as aluminum, magnesium, calcium, sodium, potassium, titanium, indium, yttrium, lithium, gadolinium silver, gold, platinum, tin, lead, cesium, or barium; a multi-layer structured material such as LiF/Al, $LiO_2$/Al, 8-hydroxyquinolinolato-lithium/aluminum (Liq/Al), LiF/Ca, or $BaF_2$/Ca, but is not limited thereto. A combination comprising at least two of the foregoing may also be used. The conductive metal oxide is the same as described above.

In an embodiment, the work function of the first electrode 11 may be, for example, about 4.5 electron volts (eV) to about 5.0 eV and the work function of the second electrode 15 may be for example greater than or equal to about 4.0 eV and less than about 4.5 eV. Within these ranges, the work function of the first electrode 11 may be for example about 4.6 eV to about 4.9 eV and the work function of the second electrode 15 may be for example about 4.0 eV to about 4.3 eV.

At least one of the first electrode 11 and the second electrode 15 may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. When one of the first electrode 11 and the second electrode 15 is a non-light-transmitting (e.g., non-transparent) electrode, it may include, for example, an opaque conductive material such as aluminum (Al), silver (Ag), gold (Au), or a combination thereof.

A thickness of the electrodes (the first electrode and/or the second electrode) is not particularly limited and may be appropriately selected with consideration of the device efficiency. For example, the thickness of the electrodes may be greater than or equal to about 5 nanometers (nm), for example, greater than or equal to about 50 nm, or greater than or equal to about 1 µm. For example, the thickness of the electrodes may be less than or equal to about 100 micrometers (µm), for example, less than or equal to about 10 µm, less than or equal to about 1 µm, less than or equal to about 900 nm, less than or equal to about 500 nm, or less than or equal to about 100 nm.

The emissive layer 13 includes a quantum dot. The quantum dot (hereinafter, also referred to as a semiconductor nanocrystal) may include a Group II-VI compound, a Group III-V compound, a Group IV-VI compound, a Group IV element or compound, a Group compound, a Group compound, a Group I-II-IV-VI compound, or a combination thereof.

The quantum dot may not include cadmium. In an aspect, the quantum dot does not include cadmium. In an aspect, a content of cadmium in the quantum dot may be 0.1 weight percent (wt %) to 0.000001 wt %, or 0.01 wt % to 0.0001 wt %, based on a total weight of the quantum dot.

The Group II-VI compound may include a binary element compound including CdSe, CdTe, ZnS, ZnSe, ZnTe, ZnO, HgS, HgSe, HgTe, MgSe, MgS, or a combination thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal. A combination comprising at least two of the foregoing may also be used.

The Group III-V compound may include a binary element compound including GaN, GaP, GaAs, GaSb, AlN, AlP, AlAs, AlSb, InN, InP, InAs, InSb, or a combination thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InZnP, InPSb, or a combination thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof. The Group III-V compound may further include a Group II metal (e.g., InZnP).

The Group IV-VI compound may include a binary element compound including SnS, SnSe, SnTe, PbS, PbSe, PbTe, or a combination thereof; a ternary element compound including SnSeS, SnSeTe, SnSTe, PbSeS, PbSeTe, PbSTe, SnPbS, SnPbSe, SnPbTe, or a combination thereof; or a quaternary element compound including SnPbSSe, SnPbSeTe, SnPbSTe, or a combination thereof.

Examples of the Group compound may include $CuInSe_2$, $CuInS_2$, CuInGaSe, or CuInGaS, but are not limited thereto. Examples of the Group I-II-IV-VI compound may include CuZnSnSe or CuZnSnS, but are not limited thereto. The Group IV element or compound may include a single substance selected from Si, Ge, or a combination thereof; or a binary element compound including SiC, SiGe, or a combination thereof. A combination comprising at least two of the foregoing may also be used.

In an embodiment, the quantum dot may not include cadmium. The quantum dot may include a Group III-V compound-based semiconductor nanocrystal including indium and phosphorus. The Group III-V compound may further include zinc. The quantum dot may include a Group II-VI compound-based semiconductor nanocrystal including a chalcogen element (e.g., sulfur, selenium, tellurium, or a combination thereof) and zinc.

In the quantum dot, the aforementioned binary element compound, ternary element compound and/or the quaternary element compound, respectively exist in a uniform concentration in the semiconductor nanocrystal particle or may be present in partially different concentrations in the same particle. The semiconductor nanocrystals may have a core/shell structure wherein a first semiconductor nanocrystal (shell) surrounds a second semiconductor nanocrystal (core) having the same or different composition. In an embodiment, the quantum dots may include a core including InP, InZnP, ZnSe, ZnSeTe, or a combination thereof and a shell (single layer or a multi-layered shell) including ZnSe, ZnS, ZnSeS, or a combination thereof.

The core and the shell may have an interface, and an element of at least one of the core or the shell in the interface may have a concentration gradient, for example, the concentration of the element in the shell decreases from an outer surface of the shell toward the core. The semiconductor nanocrystal may have a structure including one semiconductor nanocrystal core and a multi-layer shell surrounding the same. Herein, the term multi-layer shell refers to at least two shells (two layers) wherein each shell (layer) may be a single composition, an alloy, and/or have a concentration gradient.

In the quantum dot, the material of the shell (i.e., the shell material) and the material of the core (i.e., the core material) may have a different bandgap energy than each other. For example, the bandgap energy of the shell material may be greater than the bandgap energy of the core material. According to an aspect, the bandgap energy of the shell material may less than the bandgap energy of the core material. The quantum dot may have a multi-layer shell. In the multi-layer shell, the bandgap energy of the outer layer (i.e., the layer further away from the core) may be greater than the bandgap energy of the inner layer (i.e., the layer closer to the core). In the multi-layer shell, the bandgap energy of the outer layer may be less than the bandgap energy of the inner layer.

The absorption/photoluminescence wavelengths of the quantum dot may be modified by selecting a composition and a size of the quantum dot. A maximum photoluminescence peak wavelength of the quantum dot may be within an ultraviolet (UV) to infrared wavelength or may be a wavelength greater than the above wavelength range.

In an embodiment, the quantum dot may emit blue light. For example, maximum photoluminescence peak wavelength of the quantum dot may be greater than or equal to about 430 nm, for example, greater than or equal to about 440 nm, greater than or equal to about 450 nm, greater than or equal to about 451 nm, greater than or equal to about 452 nm, greater than or equal to about 453 nm, greater than or equal to about 454 nm, greater than or equal to about 455 nm, greater than or equal to about 456 nm, greater than or equal to about 457 nm, greater than or equal to about 458 nm, greater than or equal to about 459 nm, or greater than or equal to about 460 nm, and less than or equal to about 490 nm, for example, less than or equal to about 480 nm, less than or equal to about 470 nm, less than or equal to about 468 nm, less than or equal to about 467 nm, less than or equal to about 466 nm, or less than or equal to about 465 nm.

In an embodiment, the quantum dot may emit green light. The maximum photoluminescence peak wavelength of the quantum dot may be greater than or equal to about 490 nm, for example, greater than or equal to about 500 nm, greater than or equal to about 510 nm, greater than or equal to about 520 nm, or greater than or equal to about 530 nm, and less than or equal to about 560 nm, less than or equal to about 550 nm, less than or equal to about 545 nm, less than or equal to about 540 nm, or less than or equal to about 535 nm.

In an embodiment, the quantum dot may emit red light. The maximum photoluminescence peak wavelength of the quantum dot may be greater than or equal to about 600 nm, for example, greater than or equal to about 610 nm, greater than or equal to about 615 nm, or greater than or equal to about 620 nm and less than or equal to about 650 nm, less than or equal to about 645 nm, less than or equal to about 640 nm, less than or equal to about 635 nm, or less than or equal to about 630 nm.

The quantum dot may have quantum efficiency of greater than or equal to about 10%, for example, greater than or equal to about 30%, greater than or equal to about 50%, greater than or equal to about 60%, greater than or equal to about 70%, greater than or equal to about 90%, or even about 100%.

The quantum dot may have a relatively narrow spectrum. The quantum dot may have, for example, a full width at half maximum (FWHM) of a photoluminescence wavelength spectrum of less than or equal to about 50 nm, for example, less than or equal to about 45 nm, less than or equal to about 40 nm, or less than or equal to about 30 nm.

The quantum dot(s) may have a particle size (or an average particle size) of greater than or equal to about 1 nm and less than or equal to about 100 nm. The particle size may refer to a diameter or an equivalent diameter which is calculated under the assumption it has a spherical shape based upon a 2D image obtained by (e.g., transmission) electron microscope analysis. The quantum dot(s) may have a particle size (or an average particle size) of about 1 nm to about 50 nm or about 1 nm to about 20 nm, and may be, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, or less than or equal to about 10 nm. The shapes of the quantum dot(s) are not particularly limited. For example, the quantum dot may having a shape which includes a sphere, a polyhedron, a pyramid, a multipod, a square, a rectangular parallelepiped, a nanotube, a nanorod, a nanowire, a nanosheet, or a combination thereof, but is not limited thereto.

The quantum dot may be commercially available or may be appropriately synthesized. When the quantum dot is synthesized as a colloidal dispersion, the particle size of the quantum dot may be relatively freely and uniformly controlled.

The quantum dot may include an organic ligand (e.g., a ligand having a hydrophobic moiety or a hydrophilic moiety) on a surface thereof. The organic ligand may be attached (e.g., bound) to a surface of the quantum dot. The organic ligand may include RCOOH, $RNH_2$, $R_2NH$, $R_3N$, —RSH, $R_3PO$, $R_3P$, ROH, RCOOR, $RPO(OH)_2$, RHPOOH, $R_2POOH$, or a combination thereof, wherein, R is independently a C3 to C40 substituted or unsubstituted aliphatic hydrocarbon group, such as a C3 to C40 (e.g., C5 or greater and C24 or less) substituted or unsubstituted alkyl, a C3 to C40 substituted or unsubstituted alkenyl, a C6 to C40 (e.g., C6 or greater and C20 or less) substituted or unsubstituted aromatic hydrocarbon group, such as a substituted or unsubstituted C6 to C40 aryl group, or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, or trioctylphosphine; an oxide of a phosphine compound such methyl phosphine oxide, ethyl phosphine oxide, propyl phosphine oxide, butyl phosphine oxide, pentyl phosphine oxide, tributylphosphine oxide, octyl phosphine oxide, dioctyl phosphine oxide, or trioctyl phosphine oxide; a diphenyl phosphine compound, a triphenyl phosphine compound, or an oxide compound thereof; C5 to C20 alkyl phosphinic acid such as hexylphosphinic acid, octylphosphinic acid, dodecanephosphinic acid, tetradecanephosphinic acid, hexadecanephosphinic acid, octadecanephosphinic acid; a C5 to C20 alkyl phosphonic acid such as hexyl phosphonic acid, octyl phosphonic acid, dodecane phosphonic acid, tetradecane phosphonic acid, hexadecane phosphonic acid, octadecane phosphonic acid; but are not limited thereto. A combination comprising at least one of the foregoing may also be used. The quantum dot may include a hydrophobic organic ligand either alone or in a combination comprising two or more hydrophobic ligands. The hydrophobic organic ligand may not include a photopolymerizable moiety (e.g., acrylate group, methacrylate group, etc.).

In an embodiment, the emissive layer 13 may include a monolayer comprising a plurality of quantum dots. In another embodiment, the emissive layer 13 may include at least one monolayer comprising a plurality of quantum dots, for example, 2 or more layers, 3 or more layers, or 4 or more layers, and 20 or less layers, or 10 or less layers, 9 or less layers, 8 or less layers, 7 or less layers, or 6 or less layers.

The emissive layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emissive layer 13 may have, for example, a thickness of about 10 nm to about 150 nm, for example about 10 nm to about 100 nm, for example about 10 nm to about 50 nm.

A HOMO energy level of the emissive layer 13 may be greater than or equal to about 5.1 eV, greater than or equal to about 5.2 eV, greater than or equal to about 5.3 eV, greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emissive layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or than or equal to about 6.2 eV.

The emissive layer 13 may have, for example, a LUMO energy level of less than or equal to about 4 eV, less than or equal to about 3.9 eV, less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emissive layer 13 may have a LUMO energy level of greater than or equal to about 2 eV.

If desired, the light emitting device according to an embodiment may further include a hole auxiliary layer. The hole auxiliary layer 12 is disposed between the first electrode 11 and the emissive layer 13. The hole auxiliary layer 12 may include a hole injection layer (HIL), a hole transport layer (HTL), and/or an electron blocking layer (EBL). The hole auxiliary layer 12 may be a single layer or a multi-layer structure including adjacent layers of different components.

The HOMO energy level of the hole auxiliary layer 12 may be matched with the HOMO energy level of the emissive layer 13 in order to facilitate a mobility of a hole transmitted from the hole auxiliary layer 12 to the emissive layer 13.

The HOMO energy level of the hole auxiliary layer 12 adjacent to the emissive layer is equivalent to the HOMO energy level of the emissive layer 13, or may be less than the HOMO energy level of the emissive layer 13 by a value within a range of less than or equal to about 1.0 eV. In an embodiment the hole auxiliary layer may be a hole transport layer and/or a hole injection layer.

The HOMO energy level of the hole auxiliary layer 12 may be, for example, greater than or equal to about 5.0 eV, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, about 5.2 eV to 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the hole auxiliary layer 12 may include a hole injection layer and a hole transport layer, where the hole injection layer is nearer to the first electrode 11 and the hole transport layer nearer to the emissive layer 13. Herein, the HOMO energy level of the hole injection layer may be about 5.0 eV to about 5.3 eV and the HOMO energy level of the hole transport layer may be about 5.2 eV to about 5.5 eV.

A material included in the hole auxiliary layer 12 is not particularly limited and may include, for example, poly (9,9-dioctyl-fluorene-co-N-(4-butylphenyl)-diphenylamine) (TFB), a poly(C6-C40)arylamine, poly(N-vinylcarbazole), poly(3,4-ethylenedioxythiophene (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4-bis[N-(1-naphthyl)-N-phenylamino]biphenyl (alpha-NPD), m-MTDATA (4,4',4''-tris [phenyl(m-tolyl)amino]triphenylamine), 4,4',4''-tris(N-carbazolyl)-triphenylamine (TCTA), 1,1-bis[(di-4-tolylamino)phenylcyclohexane (TAPC), a p-type metal oxide (e.g., NiO, WO₃, MoO₃, etc.), a carbon-based material such as graphene oxide, or a combination thereof, but is not limited thereto.

In the hole auxiliary layer including one or more of the hole injection layer, the hole transport layer, and the electron blocking layer, a thickness of each of the hole injection layer, the hole transport layer, and the electron blocking layer may be independently selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electron auxiliary layer 14 is disposed between the emissive layer 13 and the second electrode 15. The electron auxiliary layer 14 may include, for example, an electron injection layer (EIL), an electron transport layer (ETL), a hole blocking layer (HBL), or a combination thereof.

The electron auxiliary layer 14 may be an electron transport layer.

The electron auxiliary layer 14 includes a plurality of nanoparticles. The nanoparticles include a metal oxide including zinc.

The metal oxide may include a compound represented by Chemical Formula A:

  Chemical Formula A wherein, M is Mg, Ca, Zr, W, Li, Ti, Y, Al, or a combination thereof, and 0≤x≤0.5. In an embodiment, in Chemical Formula A, M may be magnesium (Mg). In an embodiment, in Chemical Formula A, x may be greater than or equal to about 0.01 and less than or equal to about 0.3, for example, less than or equal to about 0.25, less than or equal to about 0.2, or less than or equal to about 0.15.

The metal oxide may include a zinc oxide, a zinc magnesium oxide, or a combination thereof. The absolute value of LUMO energy level of a quantum dot included in the emissive layer may be less than the absolute value of LUMO energy level of the metal oxide. According to another embodiment, the LUMO energy level absolute value of the quantum dot may be greater than the LUMO absolute value of the metal oxide ETL. The absolute value of LUMO energy level of a blue QD may be less than the absolute value of LUMO energy level of the metal oxide ETL. The electron injection which occurs in the electroluminescent device including a blue QD may be different from electron injection which occurs in a light emitting device including a red or a green quantum dot.

An average particle size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may have a spherical shape. The nanoparticles may not have a rod shape. The nanoparticles may not have a nanowire shape.

In an embodiment, the electron auxiliary layer 14 may, include one or more of an electron injection layer, an electron transport layer, or a hole blocking layer. A thickness of each of the electron injection layer, the electron transport layer, and the hole blocking layer may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

In a device according to an embodiment, a second electrode 15 (a cathode) is disposed on a portion of the surface 14a of the electron auxiliary layer 14. The second electrode 15 does not cover the entire surface of the electron auxiliary layer 14. The second electrode 15 has a first surface 15a facing the surface 14a of the electron auxiliary layer 14 and a second surface 15b opposite to the first surface 15a.

The light emitting device according to an embodiment includes a polymer layer 16 disposed on (e.g., directly on) at least a portion of the second surface 15b of the second electrode 15 and disposed on (e.g. directly on) at least a portion of the surface 14a of the electron auxiliary layer 14. The polymer layer 16 may disposed on and cover the entire area of the surface 14a of the electron auxiliary layer 14, and may be disposed on and cover the entire area of the second surface 15b of the second electrode 15. In an embodiment, the polymer layer 16 may be disposed on the entire area of the second surface 15b of the second electrode 15. The polymer layer 16 includes a polymer which is a polymerization product of a monomer combination including a thiol compound having at least one thiol group and an unsaturated compound having at least two carbon-carbon unsaturated bonds. The thiol compound may include a multiple thiol compound having at least two thiol groups, a monothiol compound having one thiol group, or a combination thereof.

The polymer layer may be disposed directly on (e.g., in contact with) at least one portion of the second surface of the second electrode and at least one portion of the surface of the electron auxiliary layer. The polymer layer may cover the entire portion (e.g., the entire area) of the second surface of the second electrode and may cover the entire portion of the surface of the electron auxiliary layer except for the portion on which the second electrode is disposed. The polymer layer may have, for example, a degree of polymerization (e.g., a curing degree) as confirmed by infrared spectroscopic analysis, of greater than or equal to about 95%, for example, greater than or equal to about 96%, greater than or equal to about 97%, greater than or equal to about 98%, or greater than or equal to about 99%.

The monomer combination including a thiol compound may include a multiple thiol compound and the multiple thiol compound may be represented by Chemical Formula 1:

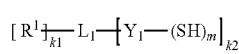

Chemical Formula 1 wherein, in Chemical Formula 1, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group, and are not simultaneously hydrogen), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' or —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkenylene group or a substituted or unsubstituted C3 to C30 alkenylene group where at least one methylene (—$CH_2$—) is replaced by a sulfonyl group (—$SO_2$—), a carbonyl group ((—C(=O))), an ether group (—O—), a sulfide (—S—), a sulfoxide group (—SO—), an ester group (—C(=O)O—), an amide group (—C(=O)NR—, wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a substituted C2 to C30 alkylene group or a substituted or unsubstituted C3 to C30 alkenylene group where at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, m is an integer of 1 or greater, for example 1 to 10,
k1 is 0 or an integer of 1 or greater, for example 1 to 10,
k2 is an integer of 1 or greater, for example 1 to 10, and
the sum of m and k2 is an integer of 3 or greater, for example 3 to 20, provided that when $Y_1$ is not a single bond, m does not exceed the valence of $Y_1$, and the sum of k1 and k2 does not exceed the valence of Li.

The thiol compound (e.g., monothiol compound or the multiple thiol compound) may include a center moiety and at least one HS—R—* group bound to the center moiety (wherein, R is a direct bond, a substituted or unsubstituted C1 to C30 aliphatic hydrocarbon group, a sulfonyl group, a carbonyl group, an ether group, a sulfide group, a sulfoxide group, an ester group, an amide group, or a combination thereof, and * represents a point of attachment), and the center moiety is a carbon atom, a substituted or unsubstituted C1 to C30 aliphatic hydrocarbon group, a substituted or unsubstituted C3 to C30 alicyclic hydrocarbon group (e.g., tricycloalkane such as tricyclodecane), a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

In the HS—R—* group bound to the center moiety, the R may be a substituted C2 to C30 aliphatic hydrocarbon group where at least one methylene is replaced by a sulfonyl group, a carbonyl group, an ether group, a sulfide group, a sulfoxide group, an ester group, an amide group, or a combination thereof.

The multiple thiol compound may be represented by Chemical Formula 1-1:

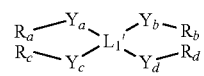

Chemical Formula 1-1 wherein, in Chemical Formula 1-1,
$L_1'$ is the same as $L_1$ of Chemical Formula 1, and may be for example, carbon, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, and $R_a$ to $R_d$ are independently $R^1$ of Chemical Formula 1 or SH, provided that at least two of $R_a$ to $R_d$ are SH.

The center moiety, e.g., $L_1$ or $L_1'$ of Chemical Formula 1 or Chemical Formula 1-1, may include a triazine moiety, a triazinetrione moiety, a quinoline moiety, a quinolone moiety, a naphthalene moiety, or a combination thereof.

The multiple thiol compound of Chemical Formula 1 may include nonanedithiol, glycol dimercaptopropionate (e.g., ethylene glycol dimercaptopropionate), trimethylolpropane tris(3-mercaptopropionate) having the structure of Chemical Formula 1-2, pentaerythritol tetrakis(3-mercaptopropionate) having the structure of Chemical Formula 1-3, pentaerythritol tetrakis(2-mercaptoacetate) having the structure of Chemical Formula 1-4, tris[2-(3-mercaptopropionyloxy)alkyl] isocyanurate having the structure of Chemical Formula 1-5, a compound having the structure of Chemical Formula 1-6, a compound having the structure of Chemical Formula 1-7, a compound having the structure of Chemical Formula 1-8, or a combination thereof:

Chemical Formula 1-2
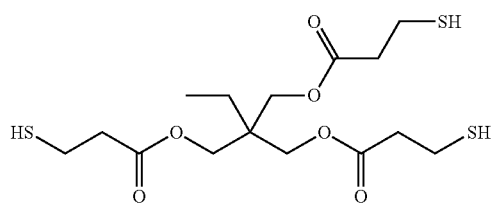

Chemical Formula 1-3
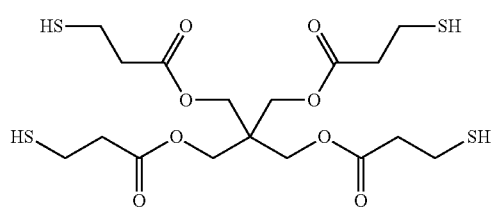

Chemical Formula 1-4
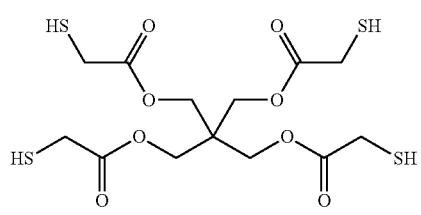

Chemical Formula 1-5
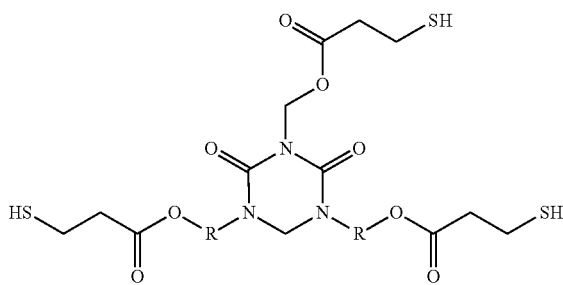

wherein, in Chemical Formula 1-5, R is a substituted or unsubstituted C1 to C10 alkylene;

Chemical Formula 1-6
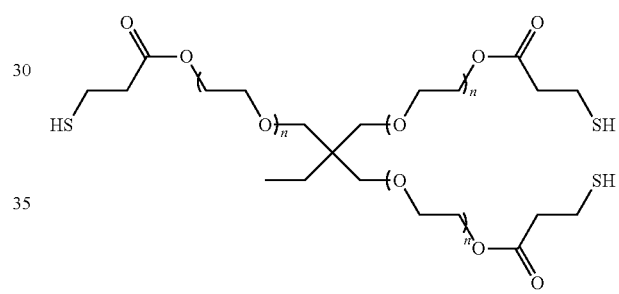

wherein, n is an integer of 1 to 20,

Chemical Formula 1-7
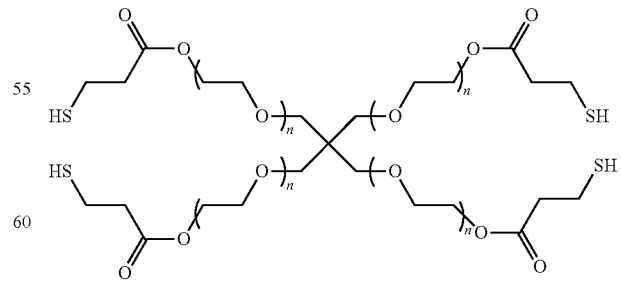

wherein, n is an integer of 1 to 20,

Chemical Formula 1-8

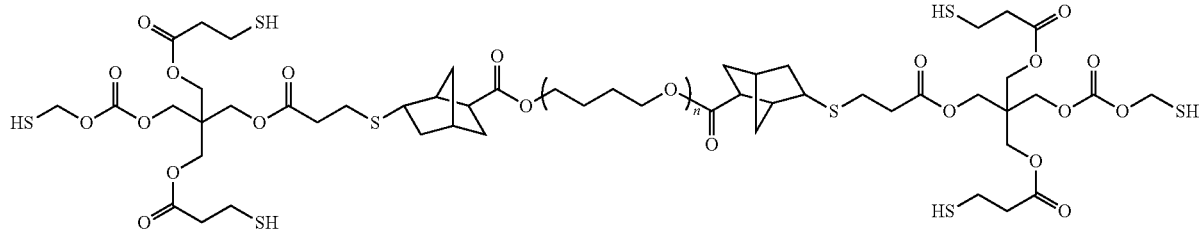

wherein, n is an integer of 1 to 20.

The multiple thiol compound may include a dimercaptoacetate compound, a trimercaptoacetate compound, a tetramercaptoacetate compound, a dimercaptopropionate compound, a trimercaptopropionate compound, a tetramercaptopropionate compound, an isocyanate compound including at least two mercaptoalkylcarbonyloxyalkyl groups, an isocyanurate compound including at least two mercaptoalkyl carbonyloxyalkyl groups, or a combination thereof.

The unsaturated compound may be represented by Chemical Formula 2:

Chemical Formula 2

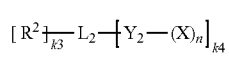

wherein, X is a C2-C30 aliphatic organic group having a carbon-carbon double bond or a carbon-carbon triple bond, a C6-C30 aromatic organic group having a carbon-carbon double bond or a carbon-carbon triple bond, or a C3-C30 alicyclic organic group having a carbon-carbon double bond or a carbon-carbon triple bond, $R^2$ is hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group; a hydroxy group, —$NH_2$, a substituted or unsubstituted C1 to C30 amine group (—NRR', wherein R and R' are independently hydrogen or a C1 to C30 linear or branched alkyl group), an isocyanate group, a halogen, —ROR' (wherein R is a substituted or unsubstituted C1 to C20 alkylene group R' is hydrogen or a C1 to C20 linear or branched alkyl group), an acyl halide group (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are independently hydrogen or a C1 to C20 linear or branched alkyl group), $L_2$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkylene group or a substituted or unsubstituted C3 to C30 alkenylene group where at least one methylene (—$CH_2$—) is replaced by a sulfonyl group (—$SO_2$—), a carbonyl group ((—C(=O)—), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, $Y_2$ is a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof, n is an integer of 1 or greater, for example, 1 to 10, k3 is 0 or an integer of 1 or greater, for example, 1 to 10, k4 is an integer of 1 or greater, for example, 1 to 10, the sum of n and k4 is an integer of 3 or more, for example 3 to 20, n does not exceed the valence of $Y_2$, and the sum of k3 and k4 does not exceed the valence of $L_2$.

In Chemical Formula 2, X may be an acrylate group, a methacrylate group, a C2 to C30 alkenyl group, a C2 to C30 alkynyl group, a substituted or unsubstituted C3 to C30 alicyclic organic group having a carbon-carbon double bond or a carbon-carbon triple bond in the ring, a substituted or unsubstituted C3 to C30 heterocycloalkyl group having a carbon-carbon double bond or a carbon-carbon triple bond in the ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

The unsaturated compound may include a center moiety and at least two X'—R—* groups bound to the center moiety, wherein, X is a moiety including a carbon-carbon unsaturated bond, for example, X as defined in Chemical Formula 2, R is direct bond, a substituted or unsubstituted C1 to C30 aliphatic hydrocarbon group, where at least one methylene is replaced by sulfonyl moiety, carbonyl moiety, ether moiety, sulfide moiety, sulfoxide moiety, ester moiety, amide moiety, or a combination thereof, and * indicates a point of attachment to the center moiety. The center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof.

In the X'—R—*, R may be a substituted or unsubstituted C2 to C30 aliphatic hydrocarbon group where at least one methylene is replaced by sulfonyl moiety, carbonyl moiety, ether moiety, sulfide moiety, sulfoxide moiety, ester moiety, amide moiety, or a combination thereof.

In the center moiety or Chemical Formula 2, $L_2$ may be a triazine moiety, a triazinetrione moiety, a quinoline moiety, a quinolone moiety, a naphthalene moiety, or a combination thereof.

The substituted or unsubstituted C3 to C30 alicyclic organic group having the carbon-carbon double bond or the carbon-carbon triple bond in the ring may include a norbornene group, a maleimide group, a nadimide group, a tetrahydrophthalimide group, or a combination thereof.

In Chemical Formula 2, $L_2$ may be a group including a pyrrolidine moiety, a tetrahydrofuran moiety, a pyridinemoiety, a pyrimidine moiety, a piperidine moiety, a triazine moiety, a triazinetrione moiety, a tricycloalkane moiety (e.g. tricyclodecane), a tricycloalkene moiety, or an isocyanurate moiety.

The unsaturated compound may be a C4 to C100 diallyl compound, a C4 to C100 triallyl compound, a C4 to C100 diallylether compound, a C4 to C100 triallylether compound, a C4 to C100 di(meth)acrylate compound, a C4 to C100 tri(meth)acrylate compound, a divinyl ether compound, or a combination thereof.

The unsaturated compound of Chemical Formula 2 may be a compound represented by Chemical Formula 2-1, Chemical Formula 2-2, or Chemical Formula 2-3.

Chemical Formula 2-1

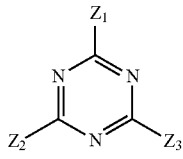

Chemical Formula 2-2

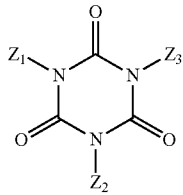

In Chemical Formulae 2-1 and 2-2, $Z_1$ to $Z_3$ are independently a *—$Y_2$—$X_n$ group, which is the same as defined for Chemical Formula 2;

Chemical Formula 2-3

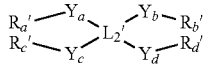

wherein, in Chemical Formula 2-3, $L_2'$ is carbon, a substituted or unsubstituted C1 to C30 alkylene group, a substituted or unsubstituted C2 to C30 alkenylene group, a substituted or unsubstituted C2 to C30 alkylene group wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof; a substituted or unsubstituted C3 to C30 alkenylene group wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group wherein at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R'_a$ to $R'_d$ are independently $R^2$ or X as defined in Chemical Formula 2, provided that at least two of $R'_a$ to R'd are X as defined in Chemical Formula 2.

The unsaturated compound may include a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, a compound of Chemical Formula 2-15, or a combination thereof:

Chemical Formula 2-4

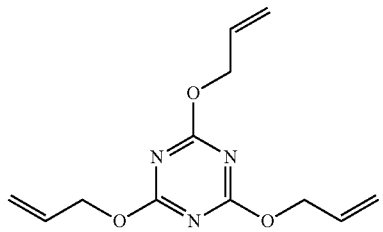

Chemical Formula 2-5

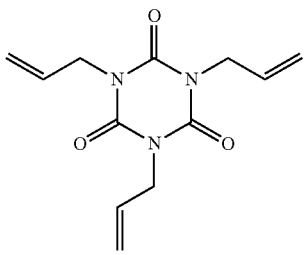

Chemical Formula 2-6

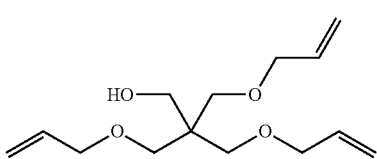

Chemical Formula 2-7

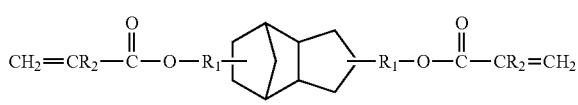

wherein, in Chemical Formula 2-7, $R_1$ is a C1 to C20 alkylene group, or a C2 to C20 alkylene group wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-8

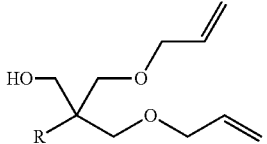

wherein, in Chemical Formula 2-8, R is a C1 to C10 alkyl group;

Chemical Formula 2-9

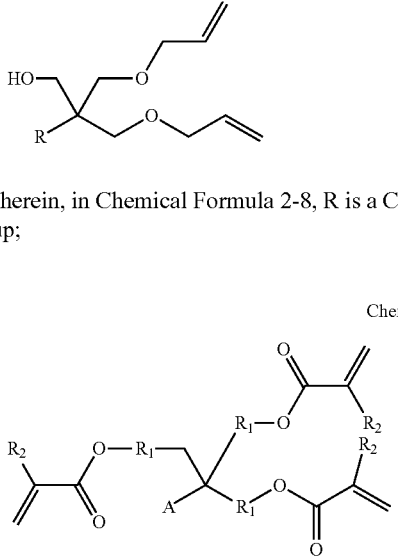

wherein, in Chemical Formula 2-9, A is hydrogen, a C1 to C10 alkyl group, or a hydroxy group, $R_1$ is a direct bond (single bond), a C1 to C20 alkylene group, or a C2 to C20 alkylene wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-10

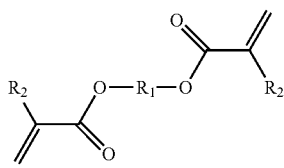

wherein, in Chemical Formula 2-10, $R_1$ is a single bond, a C1 to C20 alkylene, or a C1 to C20 alkylene wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-11

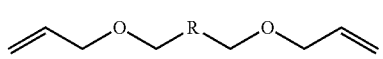

wherein, in Chemical Formula 2-11, R is a bond, a C1 to C20 alkylene, or a C2 to C20 alkylene wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and Chemical Formula 2-12

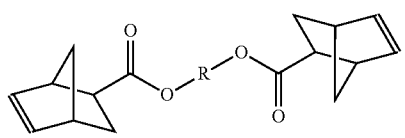

wherein, in Chemical Formula 2-12, R is a C1 to C20 alkylene, or a C1 to C20 alkylene wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, Chemical Formula 2-13

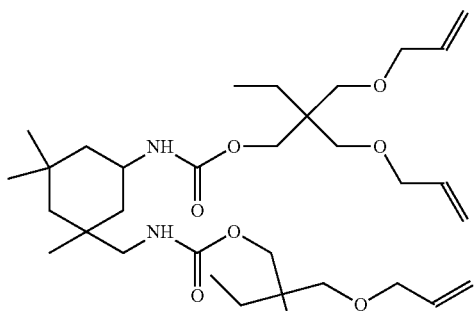

Chemical Formula 2-14

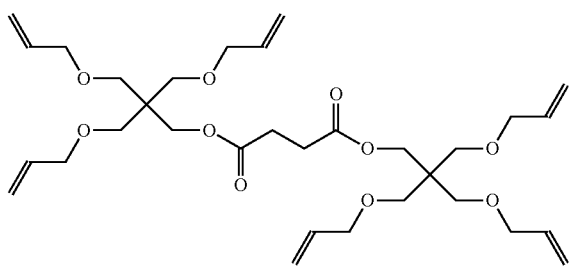

Chemical Formula 2-15

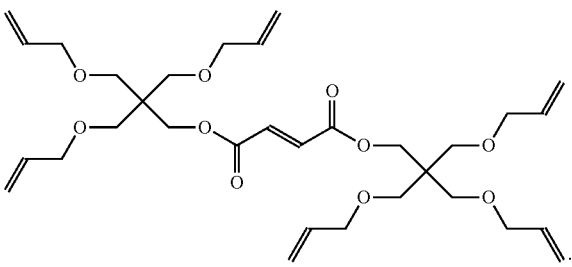

The polymer layer may not include an unsaturated carboxylic acid, a saturated carboxylic acid, a polymer thereof, or a combination thereof. For example the polymer layer may not include (meth)acrylic acid, benzoic acid, 3-butenoic acid, crotonic acid, butyric acid, isobutyric acid, acetic acid, a polymer thereof, or a combination thereof.

The polymer layer may not include an epoxy moiety or azacyclopropane moiety. For example, the polymer layer may not include a polyethyleneimine moiety.

The polymer layer may include a monothiol compound including one thiol group at the terminal end and/or a multi-thiol compound including at least two thiol groups. In an embodiment, the monothiol compound may include a C2 to C30 monothiol such as pentanethiol, hexanethiol, heptanethiol, octanethiol, nonanethiol, decanethiol, or dodecanethiol).

The polymer layer may further include a moiety derived from a monounsaturated compound having one carbon-carbon unsaturated bond at the terminal end (e.g., C3 to C40 monoacrylate compound).

When plurality of nanoparticles including a zinc-containing metal oxide are employed in the electron auxiliary layer of the quantum dot-based electroluminescent device, the electron auxiliary layer is expected to show improved electron transport capability, hole-blocking property, and electron mobility. In the quantum dot-based electroluminescent device, the emissive layer and the electron auxiliary layer may be prepared by a solution process, so the cost may be saved. However, without being bound by any particular theory, it is believed that the preparation of the electron auxiliary layer including on the zinc-containing metal oxide for the quantum dot-based device may be technically challenging since it is difficult to prepare such an electron auxiliary layer having the desired film qualities and properties.

In an embodiment, the metal oxide nanoparticles have a crystalline structure. In an embodiment, the metal oxide nanoparticles may be amorphous. The metal oxide nanoparticle in the electron transport layer may be favorable for providing high electron mobility and low resistance, but which also results in an increased leakage current. In addition, it is believed that the oxygen vacancy defect present on ZnO surface may also be a factor causing the deterioration in performance. A packing density of the QDs in the emissive layer and the metal oxide nanoparticles in the electron auxiliary layer (for example, each of which are spherical shape particles) may be important. However, a quantum dot-based emissive layer and an electron auxiliary layer based on zinc-containing metal oxide nanoparticles are vulnerable to the formation of a plurality of voids and cracks therein that may be easily formed with a grain boundary due to the agglomeration of the plurality of nanoparticles (or the quantum dots). The voids and cracks may make the film morphology irregular, which when combined with a high mobility of the zinc oxide particles, generates a high level of leakage current, thereby resulting in a deterioration in both luminance and efficiency.

In a cadmium-free QD-light emitting diode (QD-LED), the aforementioned electron auxiliary layer may cause an increase of the leakage current, which may significantly decrease the efficiency and the life-span of the electroluminescent device. A ligand that passivates the surface of the cadmium-free quantum dot is bound to the surface by a relatively weak binding force, and as a result, the ligand tends to be easily detached (eliminated) therefrom by heat and/or a carrier (e.g., a hole injected from the positive electrode). The detachment of the ligand is a factor contributing to the shortened life-span of the cadmium-free quantum dot-based electroluminescent device. As the blue light emitting quantum dot has a high level of excitation energy, the ligand detachment problems caused by holes injected during the device operation may be more serious in case of the blue light emitting quantum dot.

The above-described problems may prevent the quantum dot-based light emitting device, particularly one prepared by a solution process, from utilizing its potential merits associated with the use of quantum dots (e.g., high quantum yield, improved color purity, high stability, spectral tenability, etc.).

The device according to an embodiment has the aforementioned polymer layer on at least a portion of the surface of the second electrode and at least a portion of the surface of the electron auxiliary layer and may solve the aforementioned problems.

Without being bound by any particular theory, it is believed that the polymerization product including a moiety derived from a thiol compound and an unsaturated compound, and included in the polymer layer, may penetrate into the electron auxiliary layer and into the emissive layer, thereby filling voids/cracks generated in the preparation of the electron auxiliary layer and the emissive layer, thereby mitigating the negative influence of the voids/cracks on the electron transport capability of the electron auxiliary layer and improving the film uniformity of the electron auxiliary layer and the quantum dot-included emissive layer. The ligand detachment from the surface of the quantum dot may also be suppressed and the polymerization product may passivate again the region where the ligand is detached.

Furthermore, without being bound by any particular theory, it is believed that a monomer combination used in the formation of the polymer layer and/or the polymerization product including a moiety derived from the monomer combination and included in the polymer layer may effectively fill voids and cracks present in the electron auxiliary layer, the emissive layer, the surface thereof, or a combination thereof without having any substantial influence (e.g., while maintaining carrier path of electron) on a carrier path of electrons during formation of the polymer layer (or even during the device operation) and, and thus it is estimated that the light emitting device according to an embodiment may have a prolonged life-span, enhanced luminous efficiency, and enhanced luminance.

Without being bound by any particular theory, it is believed that the polymerization product included in the polymer layer and/or any unreacted monomer (e.g., multiple thiol compound, unsaturated compound, etc.) may penetrate/diffuse into emissive layer during the forming of the polymer layer, or even during the device operation. As a result, the region(s) of the emissive layer where the ligand is detached from the surface of the quantum dot may be passivated by thiol residues during device operation, so as to enhance the properties of the device (photoluminescence characteristics, stability and life-span).

In an embodiment, the polymer layer may not include an unsaturated carboxylic acid, a saturated carboxylic acid compound, a polymer thereof, or a combination thereof. For example, the polymer layer may not include (meth)acrylic acid or a polymer thereof, benzoic acid, 3-butenoic acid, crotonic acid, butyric acid, isobutyric acid, acetic acid, propionic acid, or a combination thereof. According to the present embodiment, it has been unexpectedly discovered that a carboxylic acid compound may cause a decrease in the curing degree of the polymer layer and may have a negative influence on device encapsulation.

According to an embodiment, (at least a portion of) the second electrode, (at least a portion of) the electron auxiliary layer, and optionally at least a portion of the emissive layer may be integrated together by the polymerization product. Each of the elements (e.g., the components) of the device, according to an embodiment, may be integrated or encapsulated by the polymerization product. In an embodiment, the integration (e.g., being integrated together) may refer to the case where the corresponding components are attached to each other and may not be separated from one another for example, by application of a manual force.

In an embodiment, the electron auxiliary layer may further include sulfur between the nanoparticles. In an embodiment, the electron auxiliary layer may include an organic material between the nanoparticles, and the organic material may include the polymerization product, unreacted thiol compound, unreacted unsaturated compound, or a combination thereof. The organic material may further include an additional component included in the monomer combination including the thiol compound and the unsaturated compound, which will be described later (e.g., photoinitiator, a moiety included in a curing inhibitor, etc.). The electron auxiliary layer may include a thiol moiety, a sulfide moiety, a disulfide moiety, or a combination thereof.

The electron auxiliary layer may include carbon, and the presence of the carbon may be measured by, for example, an energy dispersive spectroscopy using a transmission electron microscope. In the electron auxiliary layer, a content of carbon may be greater than or equal to about 1 weight percent (wt %), greater than or equal to about 2 wt %, greater than or equal to about 3 wt %, greater than or equal to about 4 wt %, greater than or equal to about 5 wt %, for example, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %, based on the total weight of the electron auxiliary (transport) layer.

In the electron auxiliary layer, a content of carbon may be less than or equal to about 70 wt %, less than or equal to about 65 wt %, less than or equal to about 60 wt %, less than or equal to about 55 wt %, or less than or equal to about 50 wt %, less than or equal to about 45 wt %, less than or equal to about 40 wt %, less than or equal to about 35 wt %, or less than or equal to about 30 wt %, based on the total weight of the electron auxiliary layer.

The content of carbon relative to total number of moles of zinc in the electron auxiliary layer may be measured by energy dispersive spectroscopy of the transmission electron microscope but is not limited thereto. A content of carbon in the electron auxiliary layer may show a line profile in which the percentage of carbon decreases across the thickness of the electron auxiliary layer toward the emissive layer.

The electron auxiliary layer may include sulfur, and the presence of the sulfur may be measured by an appropriate analysis tool, such as a line profile of the energy dispersive spectroscopy of the transmission electron microscope.

According to an embodiment, the analysis of the electron microscope shows that a content of sulfur in the electron auxiliary layer may be greater than or equal to about 0.001 mol %, for example, greater than or equal to about 0.01 mol %, greater than or equal to about 0.05 mol %, greater than or equal to about 0.1 mol %, greater than or equal to about 0.5 mol %, or greater than or equal to about 1 mol %, based on the total number of moles of zinc in the electron auxiliary layer. A content of sulfur in the electron auxiliary layer may be less than or equal to about 20 mol, less than or equal to about 10 mol %, or less than or equal to about 5 mol %, based on the total number of moles of zinc in the electron auxiliary layer.

The polymerization product may include a triazine moiety, a triazinetrione moiety, a quinoline moiety, a quinolone moiety, a quinone moiety, an aryl moiety, an arylphosphine moiety, or a combination thereof.

The emissive layer may further include an organic material between the quantum dots, and the organic material may include the polymerization product, unreacted thiol compound, unreacted unsaturated compound, or a combination thereof. The organic material may further include an additional component included in the monomer combination including the thiol compound and the unsaturated compound, which will be described later (e.g., photoinitiator, a moiety included in a curing inhibitor, etc.). The electron auxiliary layer may include a thiol moiety, a sulfide moiety, a disulfide moiety, or a combination thereof.

In another embodiment, a method of manufacturing the aforementioned light emitting device includes, providing a stack structure including:

a first electrode and a second electrode facing each other, an emissive layer disposed between the first electrode and the second electrode and including quantum dots, and an electron auxiliary layer disposed between the emissive layer and the second electrode and including a plurality of nanoparticles, wherein the plurality of nanoparticles include a metal oxide including zinc, and the second electrode has a first surface facing a surface of the electron auxiliary layer and a second surface opposite to the first surface;

providing a monomer combination (hereinafter, also referred to as polymer precursor mixture) including a thiol compound (e.g., multiple thiol compound) having at least one (e.g., at least two) thiol (SH) group(s) and an unsaturated compound having at least two carbon-carbon unsaturated bonds;

applying the monomer combination on at least a portion of the second surface of the second electrode and on at least a portion of the surface of the electron auxiliary layer to form a polymer precursor layer; and conducting polymerization of the monomer combination (e.g., polymerizing (e.g., cross-linking polymerization) the thiol compound and the unsaturated compound) in the polymer precursor layer to form the light emitting device.

The method may further include disposing a hole auxiliary layer between the first electrode and the emissive layer.

The first electrode, the second electrode, the emissive layer, the plurality of nanoparticles including the metal oxide including zinc, the electron auxiliary layer, the hole auxiliary layer, the stack structure, the thiol compound, and the unsaturated compound are the same as described above.

A method of forming the stack structure is not particularly limited and may be appropriately selected. For example, the aforementioned hole auxiliary layer 12, the emissive layer including quantum dots 13, and the electron auxiliary layer 14 may be formed with a solution process, for example spin coating, slit coating, inkjet printing, nozzle printing, spraying, and/or a doctor blade coating, but is not limited thereto.

The polymer precursor mixture may include the multiple thiol compound and the unsaturated compound having at least two carbon-carbon unsaturated bonds. A method of forming the monomer combination is not particularly limited and may be appropriately selected. The monomer combination may be formed by combining the aforementioned multiple thiol compound and the unsaturated compound in an appropriate manner. In the monomer combination, a ratio of the aforementioned multiple thiol compound to the unsaturated compound is not particularly limited and may be appropriately selected. For example, the ratio of the multiple thiol compound to the unsaturated compound (a ratio between a thiol group and a carbon-carbon double bond) may be greater than or equal to about 1:0.1, for example, greater than or equal to about 1:0.2, greater than or equal to about 1:0.3, greater than or equal to about 1:0.4, greater than or equal to about 1:0.5, greater than or equal to about 1:0.6, greater than or equal to about 1:0.7, greater than or equal to about 1:0.8, greater than or equal to about 1:0.9, greater than or equal to about 1:1, greater than or equal to about 1:2 and less than or equal to about 1:10, for example, less than or equal to about 1:9, less than or equal to about 1:8, less than or equal to about 1:7, less than or equal to about 1:6, less than or equal to about 1:5, less than or equal to about 1:4, less than or equal to about 1:3, less than or equal to about 1:2, less than or equal to about 1:1.9, less than or equal to about 1:1.8, less than or equal to about 1:1.7, less than or equal to about 1:1.6, less than or equal to about 1:1.5, less than or equal to about 1:1.4, or less than or equal to about 1:1.3.

The monomer combination may further include an additional component, for example, an organic solvent, a mono-thiol compound, a mono-unsaturated compound having one carbon-carbon double bond, a curing inhibitor, a photoinitiator, a thermal initiator, or a combination thereof. The additional component may include a triazine moiety, a triazinetrione moiety, a quinolone moiety, a quinoline moiety, a quinone moiety, or a combination thereof. The amount of the additional component(s) in the polymer precursor mixture is not particularly limited but may be, for example, greater than or equal to about 0.001 parts by weight, greater than or equal to about 0.01 parts by weight, greater than or equal to about 0.1 parts by weight, greater than or equal to about 1 part by weight, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, greater than or equal to about 10 parts by weight, greater than or equal to about 11 parts by weight, greater than or equal to about 12 parts by weight, greater than or equal to about 13 parts by weight, greater than or equal to about 14 parts by weight, greater than or equal to about 15 parts by weight, greater than or equal to about 16 parts by weight, greater than or equal to about 17 parts by weight, greater than or equal to about 18 parts by weight, greater than or equal to about 19 parts by weight, greater than or equal to about or 20 parts by weight and less than or equal to about 50 parts by weight, less than or equal to about 40 parts by weight, less than or equal to about 30 parts by weight, less than or equal to about 20 parts by weight, less than or equal to about 10 parts by weight, less than or equal to about 9 parts by weight, less than or equal to about 8 parts by weight, less than or equal to about 7 parts by weight, less than or equal to about 6 parts by weight, less than or equal to about 5 parts by weight, less than or equal to about 4 parts by weight, less than or equal to about 3 parts by weight, less than or equal to about 2 parts by weight, less than or equal to about 1 parts by weight, based on 100 parts by weight of the combined weight of the multiple thiol compound and the unsaturated compound.

FIGS. 2A-2D shows a schematic view of a manufacturing method according to an embodiment, as the non-limiting example.

Referring to FIGS. 2A-2D, the monomer combination is coated on a surface of a second electrode 15 and a surface of the electron auxiliary layer 14 to provide a polymer precursor layer (FIG. 2A). In an embodiment, after forming the polymer precursor layer 16a, the monomer combination may penetrate and/or diffuse between the nanoparticles in the electron auxiliary layer 14 (FIGS. 2B, 2C, and 2D). The penetration and diffusion may be performed according to an appropriate method. For example, the penetration and/or diffusion may be performed by gravity and capillary force among nanoparticles. The penetration and diffusion may be performed in an oxygen-free atmosphere.

The method may further include allowing the stack structure on which the polymer precursor layer is formed to stand for a predetermined time period between the formation of the polymer precursor layer and the polymerization thereof.

In an embodiment, the time period may be greater than or equal to about 1 minute, greater than or equal to 2 minutes, greater than or equal to 3 minutes, greater than or equal to 4 minutes, or greater than or equal to 5 minutes and less than or equal to about 1 hour, less than or equal to about 30 minutes, or less than or equal to about 10 minutes. The penetrated and/or diffused material may fill a void and/or a crack which is present between the metal oxide nanoparticles present in the electron auxiliary layer (e.g., electron transport layer (ETL)) and/or a void and/or a crack which is present between quantum dots present in the emissive layer. It is described with non-limiting examples as follows, but it is to help the understanding the present invention, but not to limit the present invention in any way.

The monomer combination coated on the surface of the electron auxiliary layer and on the second surface of the second electrode may fill in a void which is present among metal oxide nanoparticles of the electron auxiliary layer (e.g., electron transport layer (ETL)) and may be penetrate through the layer up until the central part of the electron auxiliary layer. According to an embodiment, after forming the polymer precursor layer including the monomer combination, a substrate (e.g., cover glass) is placed on the polymer precursor layer to cover the polymer precursor layer, and subsequently pressed to spread the polymer precursor mixture across the surface of the electrode and the surface of the electron auxiliary layer. Once the monomer combination, or the polymerization product obtained therefrom, has penetrated/diffused through the thickness of the electron auxiliary layer, it then penetrates and diffuses into the emissive layer including the QD, where it may fill a void and/or crack present among the quantum dots. The monomer combination which has penetrated into the device may be (radical) polymerized (e.g., along with a lapse of time) and may be, for example, photopolymerized by irradiating the device with ultraviolet light. For example, the device may be irradiated onto the surface which is opposite to the surface including with the polymer precursor layer.

As described above, it is believed that the monomer combination (e.g., thiol compound), which has penetrated the electron auxiliary layer, may block the leakage current of the device by removing a defect on the surface of the Zn-containing oxide nanoparticles and may help to adjust the electron transport properties of the electron auxiliary layer and to block hole transfer depending upon a type of the thiol compound and the unsaturated compound (e.g., main moiety of the compounds) in the monomer combination.

In non-limiting examples, it is believed that compounds having the predetermined moiety, such as 1,3,5-triallyl-1,3,5-triazine-2,4,6(1H,3H,5H)-trione, etc. block holes during the operation of the device to improve a possibility to recombine an electron and a hole in the light emitting layer (EML).

When an organic ligand is present on the surface of a quantum dot, the penetration of the monomer combination may be limited, compared to the electron auxiliary layer including metal oxide nanoparticles. But considering the morphology of a quantum dot, it is believed that there are voids into which the monomer combination including the thiol compound and the unsaturated compound are able to penetrate. In this case, it is believed that when the polymer precursor mixture (e.g., thiol compound) is in contact with the surface of a quantum dot, it may suppress/prevent the ligand detachment which occurs during the device operation and may form a strong bond in the region where ligand is detached. The thiol moiety forming a covalent bond with the surface of the quantum dot may secure the stability of the quantum dot without detachment during device operation, and thus may enhance the life-span, luminous efficiency, and luminance of the light emitting device.

After or during the penetration and/or the diffusion of the monomer combination, the polymerization of the monomer combination (e.g., thiol compound and unsaturated compound having at least two carbon-carbon unsaturated bonds) may be performed. The polymerization of the monomer combination may be performed in an oxygen-free atmosphere. The polymer precursor mixture may further include a photoinitiator and the polymerization may include photopolymerization. The polymerization may be performed at a temperature of greater than or equal to about 30° C., for example, greater than or equal to about 40° C., or greater than or equal to about 50° C. and less than or equal to about 100° C., for example, less than or equal to about 90° C., or less than or equal to about 80° C.

A polymerization time may be greater than or equal to about 1 minute, for example, greater than or equal to about 5 minutes, greater than or equal to about 10 minutes, or greater than or equal to about 20 minutes and less than about 4 hours, for example, less than or equal to about 3 hours, less than or equal to about 2 hours, less than or equal to about 1 hour, less than or equal to about 50 minutes, less than or equal to about 30 minutes. The penetration/diffusion may be performed a temperature of at less than or equal to about 30° C. or, for example, at room temperature, and the penetration/diffusion time may be greater than or equal to about 10 minutes, for example, greater than or equal to about 20 minutes, greater than or equal to about 30 minutes, greater than or equal to about 40 minutes, greater than or equal to about 50 minutes and less than or equal to about 10 hours, for example, less than or equal to about 9 hours, less than or equal to about 8 hours, less than or equal to about 7 hours, less than or equal to about 6 hours, less than or equal to about 5 hours, or less than or equal to about 4 hours.

The aforementioned light emitting device may be applied to various electronic devices such as a display device or a light emitting device.

Hereinafter, the embodiments are illustrated in more detail with reference to examples. However, these examples are exemplary, and the present scope is not limited thereto.

EXAMPLES

Synthesis of Quantum Dots

Reference Example 1: Preparation of Blue Light Emitting Quantum Dots (1) Selenium (Se) and tellurium (Te) are respectively dispersed in trioctylphosphine (TOP) to obtain a 2 molar (M) Se/TOP stock solution and 0.1 M Te/TOP stock solution. 0.125 mmole of zinc acetate is added along with oleic acid and hexadecylamine to a reactor including trioctylamine and the resulting solution is heated under vacuum at 120° C. After one hour, an atmosphere in the reactor is converted into nitrogen.

Subsequently, the reactor is heated up to 300° C., the prepared Se/TOP stock solution and Te/TOP stock solution are rapidly injected thereinto in a Te:Se ratio of 1:25. After 60 minutes, acetone is added to the reaction solution, is rapidly cooled to room temperature, and a precipitate obtained after centrifugation is dispersed in toluene to obtain a ZnTeSe core.

(2) 1.8 millimole (mmole) (0.336 g) of zinc acetate is added along with oleic acid to a reaction flask including trioctylamine and then vacuum-treated at 120° C. for 10 minutes. The atmosphere in the flask is substituted with nitrogen ($N_2$) and a temperature is increased up to 180° C. The ZnTeSe core obtained above is added thereto, Se/TOP stock solution is added and then a temperature is increased up to 280° C. Then, 1M of STOP stock solution is added, a temperature is increased up to 320° C., the Se/TOP stock solution and S/TOP stock solution are added in predetermined amounts. After the reaction is complete, the reactor is cooled, the prepared nanocrystal is centrifuged with ethanol and is dispersed in toluene to obtain a toluene dispersion of ZnTeSe/ZnSeS core/shell quantum dots.

The used amounts of the S precursor and the Se precursor are about 0.25 moles and 0.6 moles pre one mole of the zinc precursor, respectively.

Synthesis of Metal Oxide Nanoparticles

Reference Example 2: Synthesis of $Zn_xMg_{1-x}O$ Nanoparticles

Zinc acetate dihydrate and magnesium acetate tetrahydrate are added into a reactor including dimethylsulfoxide to provide a mole ratio shown in the following chemical formula and heated at 60° C. in an air atmosphere. Subsequently, an ethanol solution of tetramethylammonium hydroxide pentahydrate is added into the reactor in a dropwise fashion at a speed of 3 milliliters (mL) per minute (mL/min). After stirring the same, the obtained $Zn_xMg_{1-x}O$ nanoparticles are centrifuged and dispersed in ethanol to provide an ethanol dispersion of $Zn_xMg_{1-x}O$ (x=0.85) nanoparticles.

The obtained nanoparticles are subjected to an X-ray diffraction analysis, so it is confirmed that they include a crystalline structure. The obtained nanoparticles are analyzed by a transmission electron microscopic analysis, and the results show that the particles have an average size of about 3 nm.

The obtained nanoparticles are measured for their UV-Vis absorption spectrum by using UV-Vis Spectrophotometer (UV-2600, SHIMADZU), and an energy bandgap of the nanoparticles are obtained from the band edge tangent line of the UV-Vis absorption spectrum. The results show that the synthesized nanoparticles have an energy bandgap of about 3.52 eV to about 3.70 eV.

Reference Example 3: Synthesis of ZnO

ZnO nanoparticles are prepared in accordance with the same procedure as in Reference Example 2, except that the magnesium acetate tetrahydrate is not used.

The obtained nanoparticles are performed with an X-ray diffraction analysis, so it is confirmed that ZnO crystal is formed. The obtained nanoparticles are performed with the transmission electron microscopic analysis, and the results show that the particles have an average size of about 3 nm.

Manufacture of Light Emitting Device

Unless otherwise noted, the following manufacturing process is performed under oxygen-free atmosphere.

Comparative Example 1

A glass substrate deposited with indium tin oxide (ITO) is surface treated with UV-ozone for 15 minutes, and then spin-coated with a PEDOT:PSS solution (H. C. Starks) and heated at 150° C. for 10 minutes under air atmosphere and heated again at 150° C. for 10 minutes under $N_2$ atmosphere to provide a hole injection layer (HIL) having a thickness of 30 nm. Subsequently, poly[(9,9-dioctylfluorenyl-2,7-diyl-co (4,4'-(N-4-butylphenyl)diphenylamine] solution (TFB) (Sumitomo) is spin-coated on the hole injection layer and heated at 150° C. for 30 minutes to provide a hole transport layer (HTL) having a thickness of 25 nm.

The toluene dispersion of the core/shell quantum dots obtained from Reference Example 1 is spin-coated on the obtained hole transport layer and a heat treatment at 80° C. for 30 minutes is performed to provide an emissive layer having a thickness of 25 nm.

A dispersion (dispersant:ethanol, optical density: 0.5 a.u) of $Zn_xMg_{1-x}O$ (x=0.85) nanoparticles obtained from Reference Example 2 is prepared. The prepared dispersion is spin-coated on the emissive layer and a heat treatment at 80° C. for 30 minutes is performed to provide an electron auxiliary layer (specifically, electron transportation layer (ETL)) having a thickness of about 60 nm. Aluminum (Al) is vacuum-deposited on a portion of the surface of the obtained electron auxiliary layer in a thickness of 90 nm to provide a second electrode, so as to provide a light emitting device shown in FIG. 1.

The obtained light emitting device is evaluated for an electro-luminescence property using a Keithley 2200 source measurement equipment and a Minolta CS2000 spectroradiometer (current-voltage-luminance measurement equipment). The current, luminance, and electroluminescence (EL) depending upon a voltage applied to the device is measured by the current-voltage-luminance measurement equipment, and thereby an external quantum efficiency is also calculated.

Figure 3A:
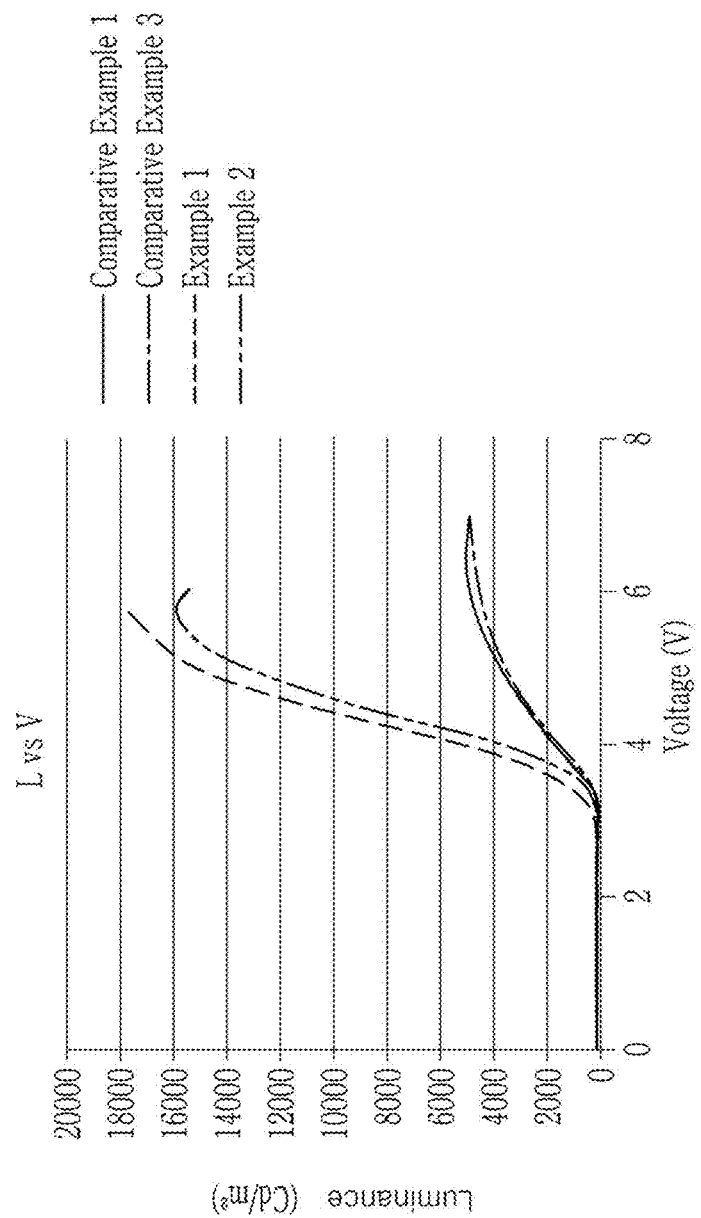
FIG. 3A is a graph of luminance (candelas per square meter, $Cd/m^2$) versus voltage (volts, V), showing the electro-luminescence properties of the light emitting devices manufactured in Examples 1 and 2 and Comparative Examples 1 and 3.
Figure 4A:
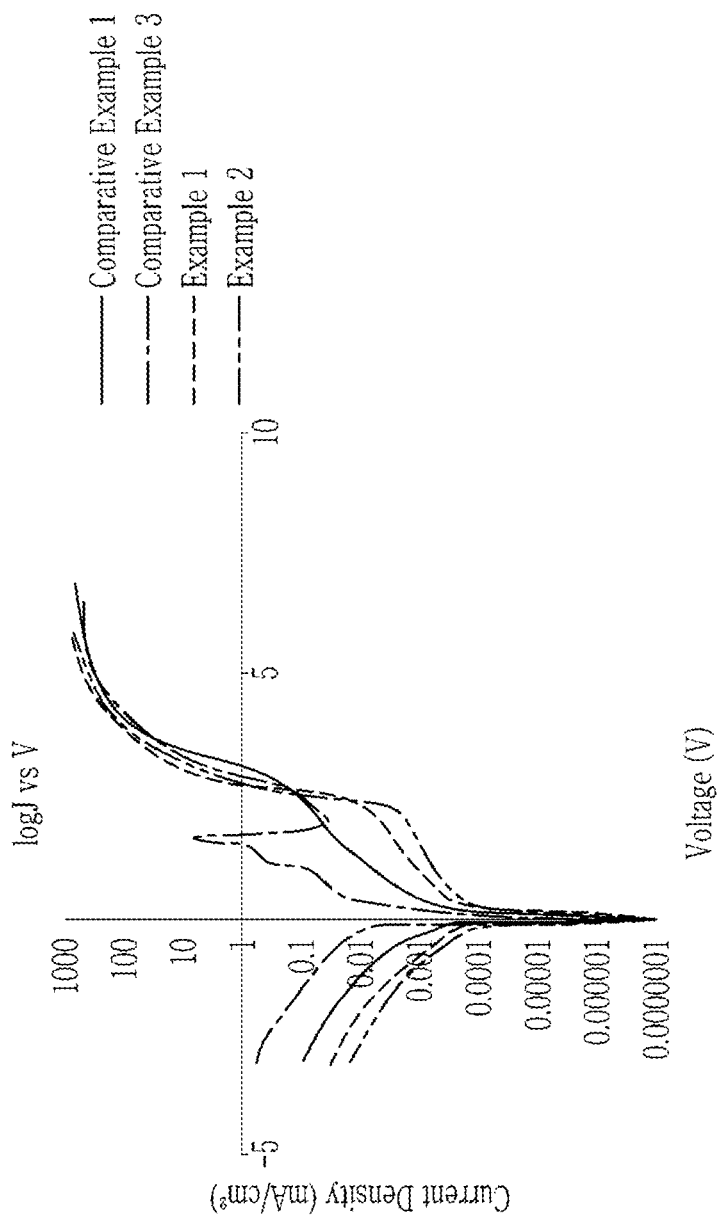
FIG. 4A is a graph of current density (milliamperes per square centimeter, $mA/cm^2$) versus voltage (V), showing electro-luminescence properties of the light emitting devices manufactured in Examples 1 and 2 and Comparative Examples 1 and 3.
Figure 5A:
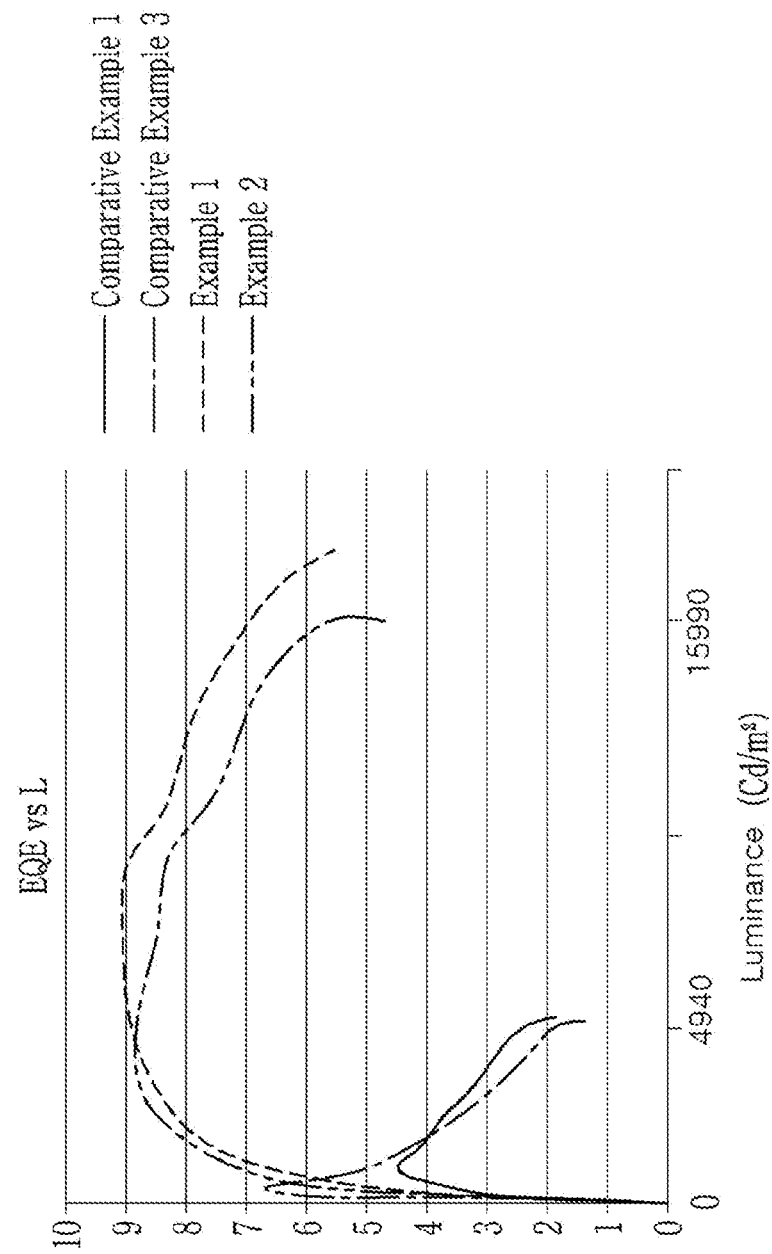
FIG. 5A is a graph of external quantum efficiency (EQE, percent (%)) versus luminance ($Cd/m^2$), showing electro-luminescence properties of the light emitting devices manufactured in Examples 1 and 2 and Comparative Examples 1 and 3.

The results are summarized and shown in Table 1, FIGS. 3A, 4A, and 5A.

Example 1

First, a quantum dot light emitting device shown in FIG. 1 is manufactured in accordance with the same procedure as in Comparative Example 1.

Then, 0.1 g of a monomer mixture including an unsaturated monomer having 2 acrylate groups and an alicyclic main moiety and a multiple thiol compound represented by the following chemical formula, at a mole ratio of 22:78, is prepared.

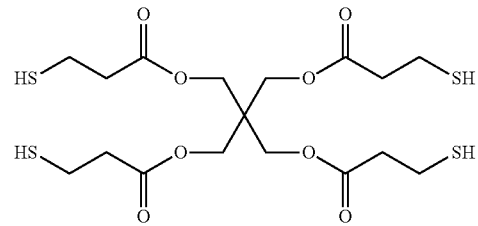 [SMILES: O=C(CCS)OCC(COC(=O)CCS)(COC(=O)CCS)COC(=O)CCS]

Nest, the prepared monomer mixture is coated on the aluminum electrode and the electron transport layer (ETL) surface (specifically, the surface of the aluminum electrode and the portion other than the portion covered by the aluminum electrode of the surface of the electron transport layer) of the obtained device to provide a polymer precursor layer. In 5 minutes, a cover glass is disposed on the polymer precursor layer and pressed, and then the monomer mixture is polymerized at an elevated temperature of about 50° C. by irradiating UV light for about 5 minutes under a state in which the device formed with the polymer precursor layer is heated by irradiating UV light (wavelength: 365 nm, intensity: 600 millijoule per square centimeter (mJ/cm$^2$)) to provide a light emitting device formed with a polymer layer (A+T resin).

The obtained light emitting device is evaluated for electroluminescent properties using a Keithley 2200 source measurement equipment and a Minolta CS2000 spectroradiometer (current-voltage-luminance measurement equipment). The current, luminance, electroluminescence (EL) depending upon a voltage applied to the device are measured by the current-voltage-luminance measurement, and thereby an external quantum efficiency is also calculated.

The results are summarized and shown in Table 1, FIGS. 3A, 4A, and 5A.

Figure 7:
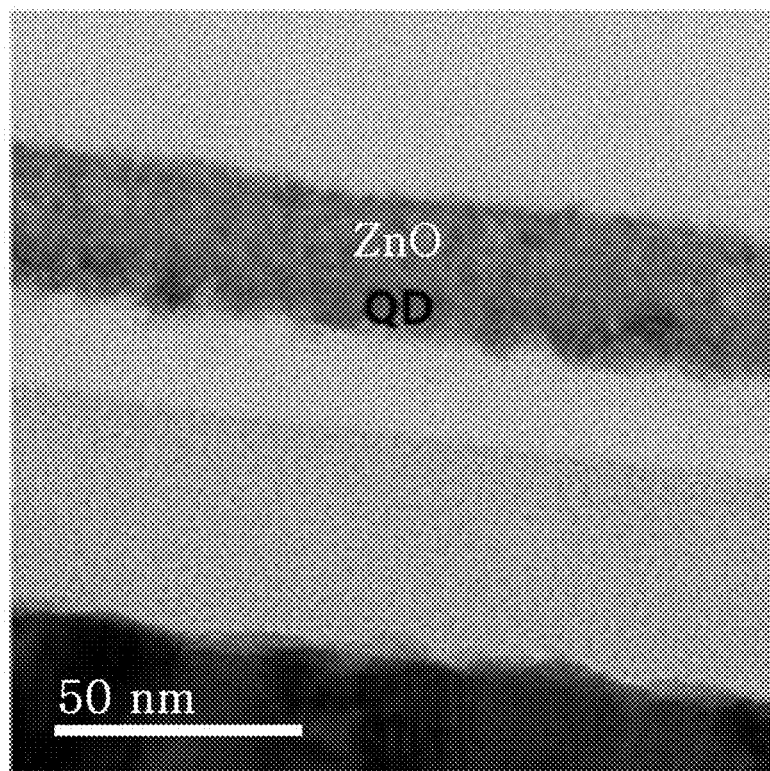
FIG. 7 shows a transmission electron microscope image of a cross-section of the light emitting device manufactured in Example 1.

A cross-section of a surface sample of the obtained light emitting device is obtained and a transmission electron microscopic analysis is performed, and the results are shown in FIG. 7.

Example 2

A light emitting device formed with a polymer layer (TE resin) is manufactured in accordance with the same procedure as in Example 1, except that 1,3,5-triallyl-1,3,5-triazine-2,4,6(1H,3H,5H)-trione (TTT) is used instead of the unsaturated monomer.

The obtained light emitting device is evaluated for electroluminescence properties using a Keithley 2200 source measurement equipment and Minolta CS2000 spectroradiometer (current-voltage-luminance measurement equipment). The current, luminance, and electroluminescence (EL) depending upon a voltage applied to the device are measured by the current-voltage-luminance measurement equipment, and thereby the external quantum efficiency is also calculated.

The results are summarized and shown in Table 1, FIGS. 3A, 4A, and 5A.

Comparative Example 2

A quantum dot light emitting device is obtained in accordance with the same procedure as in Comparative Example 1, except that the ZnO nanoparticles obtained from Reference Example 3 are used as the metal oxide nanoparticles.

The obtained light emitting device is evaluated for electroluminescence properties using a Keithley 2200 source measurement equipment and a Minolta CS2000 spectroradiometer (current-voltage-luminance measurement equipment). The current, luminance, and electroluminescence (EL) depending upon a voltage applied to the device are measured using the current-voltage-luminance measurement equipment, thereby an external quantum efficiency is also calculated.

Figure 3B:
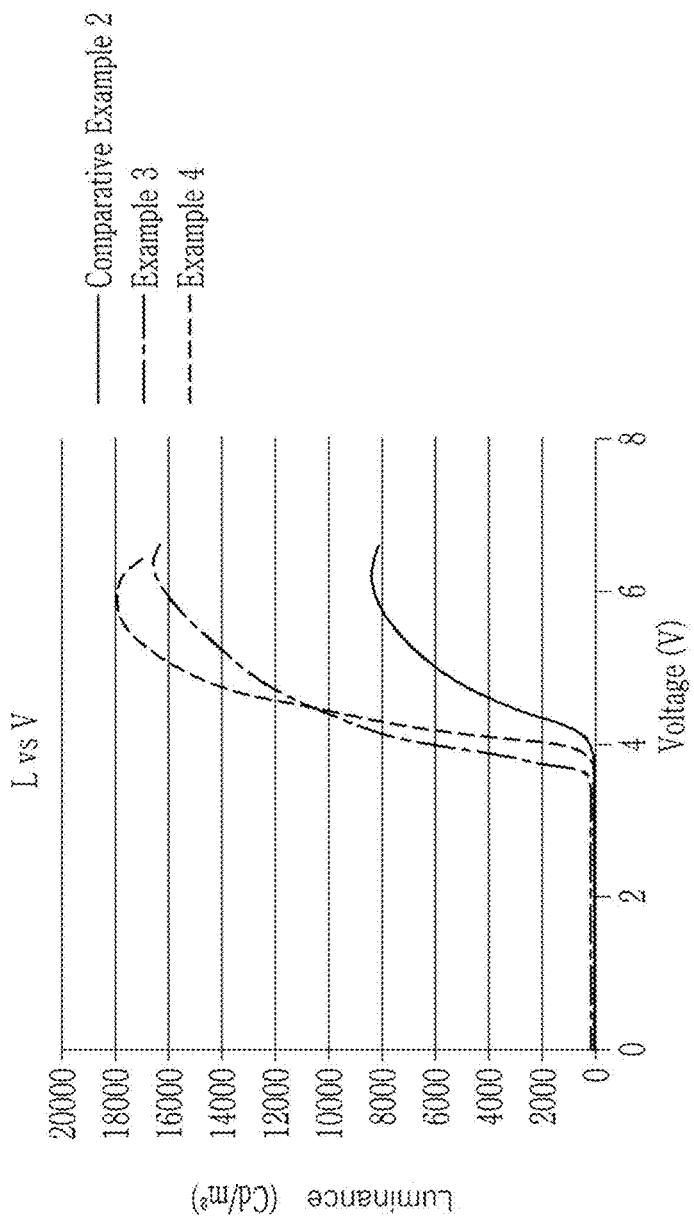
FIG. 3B is a graph of luminance ($Cd/m^2$) versus voltage (V), showing the electro-luminescence properties of the light emitting devices manufactured in Examples 3 and 4 and Comparative Example 2.
Figure 5B:
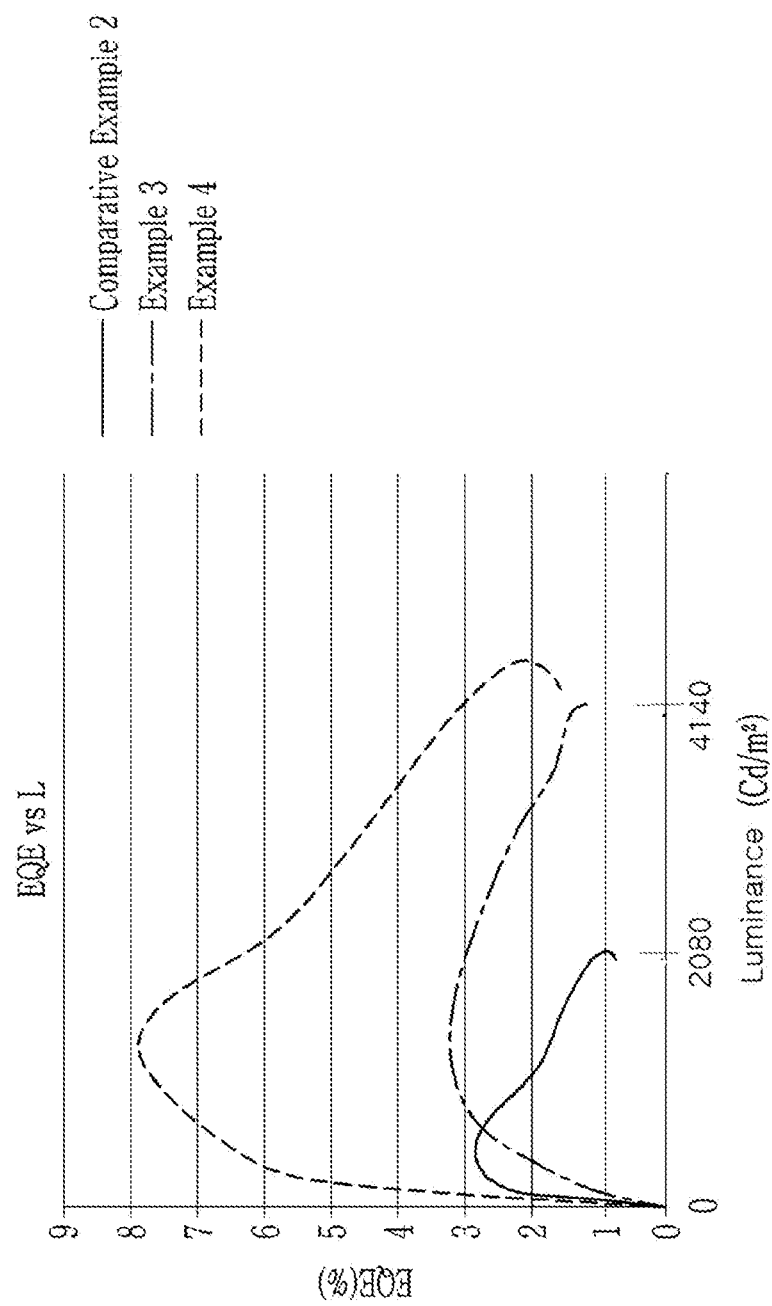
FIG. 5B is a graph of external quantum efficiency (EQE, percent (%)) versus luminance ($Cd/m^2$), showing electro-luminescence properties of the light emitting devices manufactured in Examples 3 and 4 and Comparative Example 2.

The results are summarized and shown in Table 1, FIGS. 3B, 4B, and 5B.

Example 3

A quantum dot light emitting device formed with a polymer layer (A+T resin) is obtained in accordance with the same procedure as in Example 1, except that the light emitting device which is the same as in Comparative Example 2 is used instead of the light emitting device manufactured in accordance with the same procedure as in Comparative Example 1.

The obtained light emitting device is evaluated for electroluminescence properties using a Keithley 2200 source measurement equipment and a Minolta CS2000 spectroradiometer (current-voltage-luminance measurement equipment). The current, luminance, and electroluminescence (EL) depending upon a voltage applied to the device are measured using the current-voltage-luminance measurement equipment, thereby an external quantum efficiency is also calculated.

The results are summarized and shown in Table 1, FIGS. 3B, 4B, and 5B.

Example 4

A light emitting device formed with a polymer layer (TE resin) is obtained in accordance with the same procedure as in Example 2, except that a light emitting device which is the same used as in Comparative Example 2 is used instead of the light emitting device manufactured in accordance with the same procedure as in Comparative Example 1.

The obtained light emitting device is evaluated for electroluminescence properties using a Keithley 2200 source measurement equipment and a Minolta CS2000 spectroradiometer (current-voltage-luminance measurement equipment). The current, luminance, and electro-luminescence (EL) depending upon a voltage applied to the device are measured using the current-voltage-luminance measurement equipment, thereby an external quantum efficiency is also calculated.

The results are summarized and shown in Table 1, FIGS. 3B, 4B, and 5B.

Comparative Example 3

A quantum dot light emitting device formed with a polymer layer is obtained in accordance with the same procedure as in Example 1, except that an acrylic resin (acrylate-acrylic acid copolymer, manufacturer: SDI trade name: 1004S) is used instead of the monomer mixture.

The obtained light emitting device is evaluated for electroluminescence properties using a Keithley 2200 source measurement equipment and a Minolta CS2000 spectroradiometer (current-voltage-luminance measurement equipment). The current, luminance, and electroluminescence (EL) depending upon a voltage applied to the device are measured using the current-voltage-luminance measurement equipment, thereby an external quantum efficiency is also calculated.

The results are summarized and shown in Table 1, FIGS. 3A, 4A, and 5A.

TABLE 1

| | Description | $EQE_{max}$ | Max. Cd/A | Lamda max. | FWHM (nm) | Max Lum | T 50 (h) |
|---|---|---|---|---|---|---|---|
| Comp. Ex. 1 | Blue QD/ZnMgO | 4.3 | 2.5 | 454 | 26 | 4960 | 0.4 |
| Ex. 1 | Blue QD/ZnMgO/A + T | 9.0 | 5.7 | 455 | 26 | 17720 | 8.8 |
| Ex. 2 | Blue QD/ZnMgO/TE | 8.8 | 5.7 | 455 | 26 | 15990 | 7.6 |

TABLE 1-continued

|  | Description | $EQE_{max}$ | Max. Cd/A | Lamda max. | FWHM (nm) | Max Lum | T 50 (h) |
|---|---|---|---|---|---|---|---|
| Comp. Ex. 2 | Blue QD/ZnO | 2.7 | 1.6 | 455 | 26 | 2080 | 0.2 |
| Ex. 3 | Blue QD/ZnO/A + T | 3.2 | 1.9 | 455 | 26 | 4140 | 16.5 |
| Ex. 4 | Blue QD/ZnO/TE | 7.8 | 4.5 | 455 | 26 | 4480 | 7.0 |
| Comp. Ex. 3 | Blue QD/ZnMgO/Acrylic | 6.6 | 3.7 | 454 | 26 | 4940 | 1.1 |

* $EQE_{max}$: maximum external quantum efficiency
* Max Cd/A: maximum current efficiency
* T 50 (h): on driving at 100 nit, time (hr) for gaining the luminance of 50% with respect to 100% of luminance
* Lambda max and FWHM: EL peak wavelength and full width at half maximum (FWHM)
* Max Lum: maximum luminance
* ZnMgO: $Zn_xMg_{1-x}O$ (x = 0.85)

From the results, it is confirmed that the light emitting devices according to Examples 1 to 4 have improved electroluminescence properties and life-span characteristics comparing to the light emitting devices according to Comparative Examples.

Experimental Example 1

[1] Cross-sectional surfaces of the light emitting device according to Comparative Example 2 and the light emitting device according to Example 3 are performed with a transmission electron microscope-energy dispersive spectroscopy. The results show that a content of carbon relative to zinc in the device according to Comparative Example 2 is insignificant; on the other hand, a content of carbon relative to zinc (43 mol %), which is greater than or equal to 20 mol % in the device according to Example 3.

[2] TEM-EDX line profile is obtained for a cross-sectional surface of the light emitting device according to Example 3. The results show that a content of carbon in the electron auxiliary layer shows a maximum value on the surface facing the second electrode with a decreasing gradient moving towards the emissive layer. The TEM-EDX line profile of the cross-sectional surface of the light emitting device according to Example 3 shows that surfer is present in the electron auxiliary layer.

Experimental Example 2

The toluene dispersion of the blue light emitting core/shell quantum dots obtained from Reference Example 1 are spin-coated on a glass substrate and a heat treatment at 80° C. for 30 minutes is performed to provide a quantum dot layer having a thickness of 25 nm, and an ethanol dispersion of $Zn_xMg_{1-x}O$ (x=0.85) nanoparticles obtained from Reference Example 2 is spin-coated on the quantum dot layer and a heat treatment at 80° C. for 30 minutes is performed to provide a $Zn_xMg_{1-x}O$ layer, so as to obtain a Ref stack structure. A polymer layer is formed on the $Zn_xMg_{1-x}O$ layer of the Ref stack structure using the monomer combination according to Example 2 by irradiating UV light (wavelength: 365 nm, intensity: 600 mJ/cm$^2$) for 20 seconds, so as to prepare a stack structure having a quantum dot layer-$Zn_xMg_{1-x}O$ nanoparticle layer-polymer layer.

Figure 6:
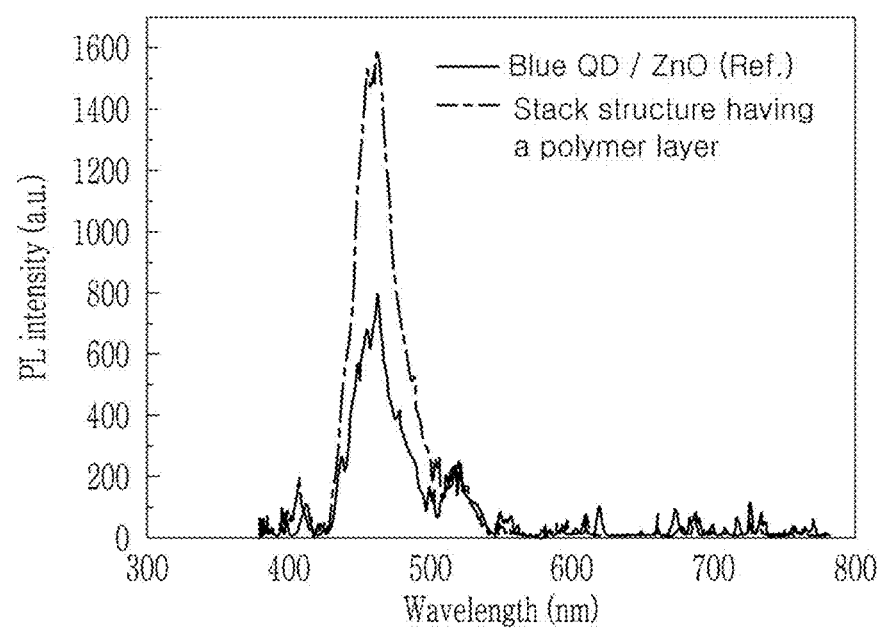
FIG. 6 is graph of photoluminescence intensity (arbitrary units, a.u.) versus wavelength (nm), showing photoluminescence properties of Ref. structure and stack structure having a polymer layer of Experimental Example 2.

The Ref stack structure and the stack structure are irradiated with light having a wavelength of 365 nm and a photoluminescence analysis is performed, and the results are shown in FIG. 6.

From the results of FIG. 6, it is confirmed that the stack structure having the polymer layer may show greatly improved luminescence properties compared to the Ref stack structure, especially greatly increased luminescence intensity at the peak emission wavelength.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a light emitting device, the method comprising:
    providing a stack structure comprising
        a first electrode and a second electrode facing each other,
        an emissive layer disposed between the first electrode and the second electrode and comprising a quantum dot, and
        an electron auxiliary layer disposed between the emissive layer and the second electrode,
    providing a polymer precursor mixture comprising a thiol compound having at least one thiol group and an unsaturated compound having at least two carbon-carbon unsaturated bonds;
    applying the polymer precursor mixture on the second electrode and on the electron auxiliary layer to form a polymer precursor layer; and
    polymerizing the thiol compound and the unsaturated compound in the polymer precursor layer to form the light emitting device.

2. The method of claim 1, wherein the electron auxiliary layer comprises a plurality of nanoparticles.

3. The method of claim 2, wherein the plurality of nanoparticles comprises a metal oxide having a composition represented by $Zn_{1-x}M_xO$ (wherein, M is Mg, Ca, Zr, W, Li, Ti or a combination thereof and $0 \le x \le 0.5$).

4. The method of claim 1, wherein the second electrode has a first surface facing a surface of the electron auxiliary layer and a second surface opposite to the first surface, and wherein the polymer precursor mixture is applied on at least a portion of the second surface of the second electrode and on at least a portion of the surface of the electron auxiliary layer.

5. The method of claim 1, wherein the quantum dot comprises a Group III-V compound comprising indium and phosphorous, a Group II-VI compound comprising zinc and a chalgen, or a combination thereof.

6. The method of claim 1, wherein the quantum dot does not comprise cadmium.

7. The method of claim 1, wherein the polymer precursor mixture further comprises a photo initiator.

8. The method of claim 1, wherein the polymer precursor mixture does not comprises a (meth)acrylic acid, benzoic acid, 3-butenoic acid, crotonic acid, butyric acid, isobutyric acid, acetic acid, propionic acid, or a combination thereof.

9. The method of claim 1, wherein the polymerizing of the polymer precursor layer comprises photopolymerization.

10. The method of claim 9, wherein the photopolymerization comprises irradiating the polymer precursor layer with UV light.

11. The method of claim 1, wherein the polymerizing of the polymer precursor layer is performed at a temperature of greater than or equal to about 30° C.

12. The method of claim 1, wherein the polymerizing is performed in an atmosphere without oxygen.

13. The method of claim 2, wherein the polymer precursor mixture penetrates and diffuses between nanoparticles of the plurality of nanoparticles in the electron auxiliary layer before the polymerizing, during the polymerizing, or a combination thereof.

14. The method of claim 1, further comprising allowing the stack structure on which the polymer precursor layer is formed to stand for at least 1 minute between the forming of the polymer precursor layer on the stack structure and the polymerizing of the thiol compound and the unsaturated compound in the polymer precursor layer.

15. A method of manufacturing a light emitting device, the method comprising:
providing a stack structure comprising
a first electrode and a second electrode facing each other,
an emissive layer disposed between the first electrode and the second electrode and comprising a quantum dot, and
an electron auxiliary layer disposed between the emissive layer and the second electrode,
providing a polymer precursor mixture comprising a thiol compound having at least one thiol group, an unsaturated compound having at least two carbon-carbon unsaturated bonds, and a photoinitiator;
applying the polymer precursor mixture on the stacked structure to form a polymer precursor layer;
irradiating the polymer precursor layer with UV light, and polymerizing the thiol compound and the unsaturated compound in the polymer precursor layer to form the light emitting device.

16. The method of claim 15, wherein the electron auxiliary layer comprises a plurality of nanoparticles.

17. The method of claim 16, wherein the plurality of nanoparticles comprises a metal oxide having a composition represented by $Zn_{1-x}M_xO$ (wherein, M is Mg, Ca, Zr, W, Li, Ti or a combination thereof and $0 \leq x \leq 0.5$).

18. The method of claim 15, wherein the second electrode has a first surface facing a surface of the electron auxiliary layer and a second surface opposite to the first surface, and wherein the polymer precursor mixture is applied on at least a portion of the second surface of the second electrode or on at least a portion of the surface of the electron auxiliary layer.

19. The method of claim 15, wherein the polymer precursor mixture does not comprises a (meth)acrylic acid, benzoic acid, 3-butenoic acid, crotonic acid, butyric acid, isobutyric acid, acetic acid, propionic acid, or a combination thereof.

20. The method of claim 15, wherein the polymerizing of the polymer precursor layer comprises photopolymerization.

* * * * *